United States Patent
Frougier et al.

(10) Patent No.: US 12,324,197 B2
(45) Date of Patent: Jun. 3, 2025

(54) SPIN-BASED GATE-ALL-AROUND TRANSISTORS

(71) Applicant: INTERNATIONAL BUSINESS MACHINES CORPORATION, Armonk, NY (US)

(72) Inventors: Julien Frougier, Albany, NY (US); Kangguo Cheng, Schenectady, NY (US); Ruilong Xie, Niskayuna, NY (US); Chanro Park, Clifton Park, NY (US); Andrew Gaul, Halfmoon, NY (US); Min Gyu Sung, Latham, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 187 days.

(21) Appl. No.: 18/051,504

(22) Filed: Oct. 31, 2022

(65) Prior Publication Data
US 2024/0145584 A1    May 2, 2024

(51) Int. Cl.
H10D 48/00    (2025.01)
(52) U.S. Cl.
CPC .................................. H10D 48/385 (2025.01)
(58) Field of Classification Search
CPC ............. H01L 27/092; H01L 27/11553; H01L 27/1158; H01L 29/66984; H01L 29/66439; H01L 29/66545; H01L 29/775; H01L 29/42392; H01L 29/41725–41791; H01L 29/7839; H01L 29/0865–0869; H01L 29/0882–0886; H01L 29/7606; H01L 29/0665; H01L 29/24; H01L 29/45; H01L 29/78696; H01L 29/66969; H01L 43/065; H01L 43/14; H01L 43/10; H01L 43/04; H10N 50/00; H10N 50/10; H10N 50/20; H10N 50/80; H10N 50/85; H10N 52/00; H10N 52/01; H10N 52/101; H10N 52/80;
(Continued)

(56) References Cited

U.S. PATENT DOCUMENTS 6,963,091 B1    11/2005    Vashchenko et al.
7,248,497 B2    7/2007    Saito et al.
(Continued)

FOREIGN PATENT DOCUMENTS

CN    111446288 B    9/2021

OTHER PUBLICATIONS

Frougier, J. et al., "Towards Spin-LED and Spin-VECSEL Operation at Magnetic Remanence"; Doctoral Thesis, University of Paris-Sud, (2014); 270 pgs.

*Primary Examiner* — Natalia A Gondarenko
(74) *Attorney, Agent, or Firm* — Intelletek Law Group, PLLC; Gabriel Daniel, Esq.

(57) ABSTRACT

A semiconductor device includes a field effect transistor (FET) with at least one Gate-All-Around (GAA) channel. A first conductive ferromagnetic Source/Drain contact is electrically connected with a first portion of the GAA channel. A second conductive ferromagnetic Source/Drain contact is electrically connected with a second portion of the GAA channel. A remanent magnetization of the first conductive ferromagnetic contact is oriented in a direction opposite to a remanent magnetization of the second conductive ferromagnetic contact.

14 Claims, 35 Drawing Sheets

(58) Field of Classification Search
CPC .... H10N 52/85; H10D 48/385; H10D 30/014; H10D 30/019; H10D 30/0194; H10D 30/023; H10D 30/027–0278; H10D 30/0415; H10D 30/43; H10D 30/47; H10D 30/481–485; H10D 30/501–509; H10D 30/502; H10D 30/504; H10D 30/6729–6739; H10D 30/6219; H10D 30/611; H10D 30/615; H10D 30/701; H10D 64/017; H10D 64/311; H10D 64/517; H10D 64/605; H10D 64/647–649; H10D 62/119; H10D 62/121; H10D 62/84; H10D 84/014–0142; H10D 84/0177; H10D 84/013; H10D 84/85; H10D 84/385
USPC ......................................... 257/252, 314, 213
See application file for complete search history.

(56) References Cited

U.S. PATENT DOCUMENTS

| | | | |
|---|---|---|---|
| 7,307,299 B2 | 12/2007 | Koo et al. | |
| 7,602,636 B2 | 10/2009 | Saito et al. | |
| 7,719,070 B2 | 5/2010 | Hall et al. | |
| 7,750,390 B2 | 7/2010 | Saito et al. | |
| 8,026,563 B2 | 9/2011 | Sugahara et al. | |
| 8,264,024 B2 | 9/2012 | Saito et al. | |
| 8,330,196 B2 | 12/2012 | Marukame et al. | |
| 8,487,359 B2 | 7/2013 | Saito et al. | |
| 8,618,590 B2 | 12/2013 | Inokuchi et al. | |
| 8,779,496 B2 | 7/2014 | Saito et al. | |
| 9,112,131 B2 | 8/2015 | Saito et al. | |
| 9,379,232 B2 | 6/2016 | Kelber et al. | |
| 9,484,423 B2 | 11/2016 | Obradovic et al. | |
| 10,388,732 B1 | 8/2019 | Frougier et al. | |
| 10,734,384 B1 | 8/2020 | Li et al. | |
| 10,818,803 B1 | 10/2020 | Frougier et al. | |
| 10,872,973 B2 | 12/2020 | Lin et al. | |
| 11,069,819 B2 | 7/2021 | Frougier | |
| 2014/0291744 A1 | 10/2014 | Saito et al. | |
| 2016/0365506 A1* | 12/2016 | Ahn | H10N 50/85 |
| 2019/0074432 A1* | 3/2019 | Kumar | H10N 50/10 |
| 2020/0083284 A1* | 3/2020 | Manipatruni | H01L 25/0655 |
| 2023/0088101 A1* | 3/2023 | Naylor | H01L 29/42392 257/29 |
| 2023/0099814 A1* | 3/2023 | Maxey | H01L 29/66969 257/29 |

\* cited by examiner

Section X

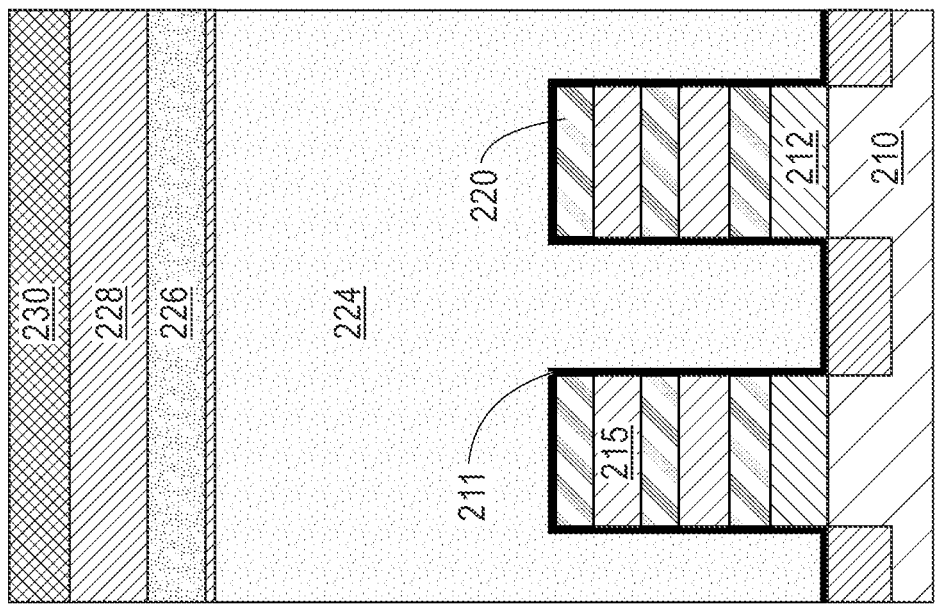
FIG. 6B Section Y
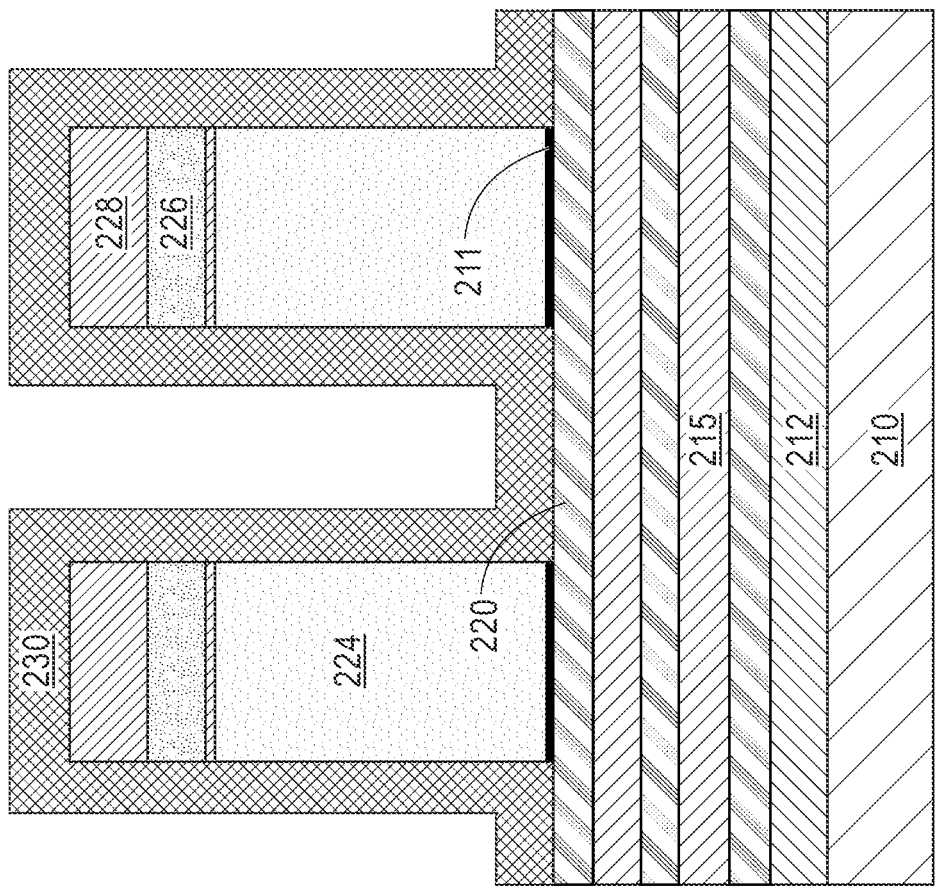
FIG. 6A Section X

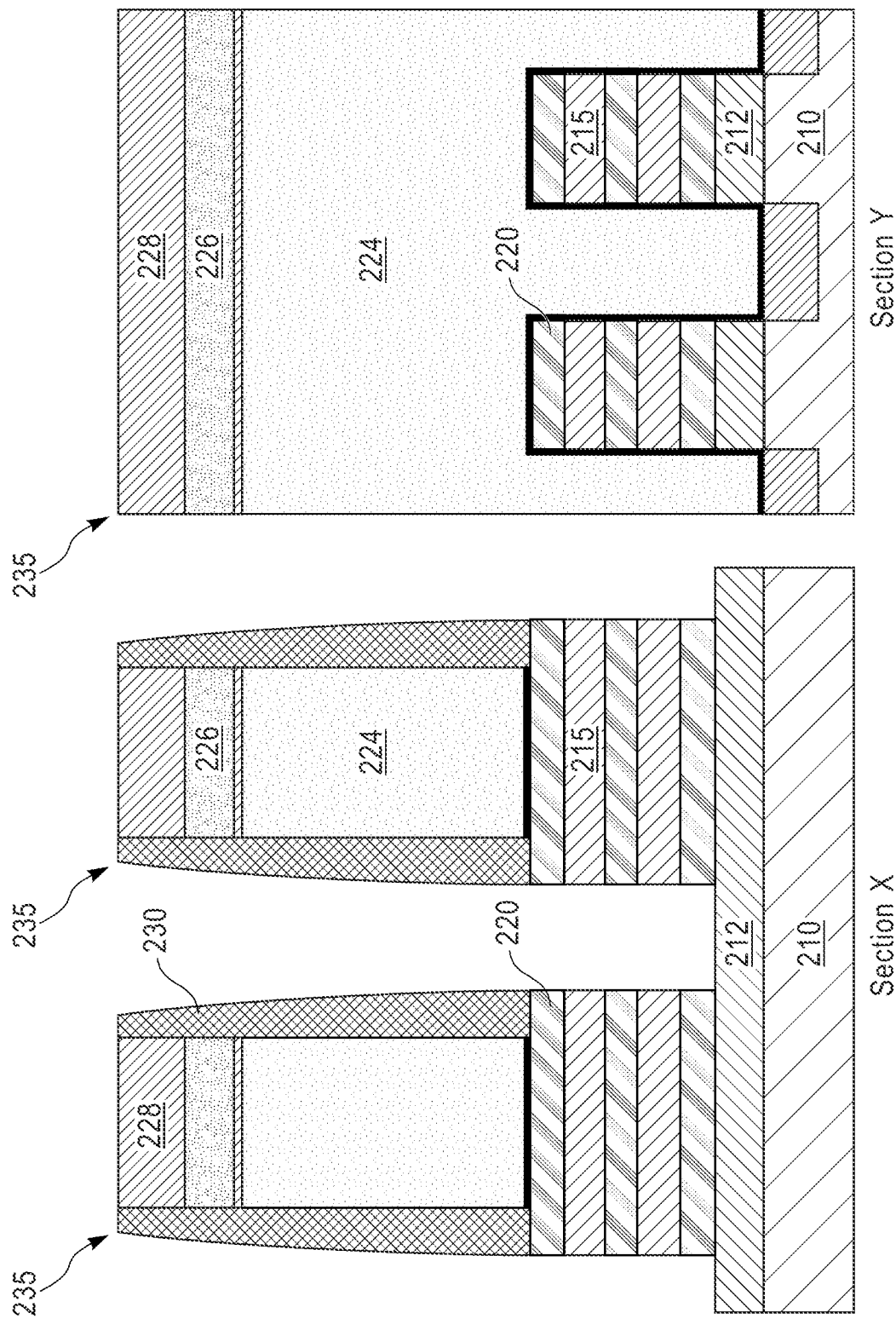

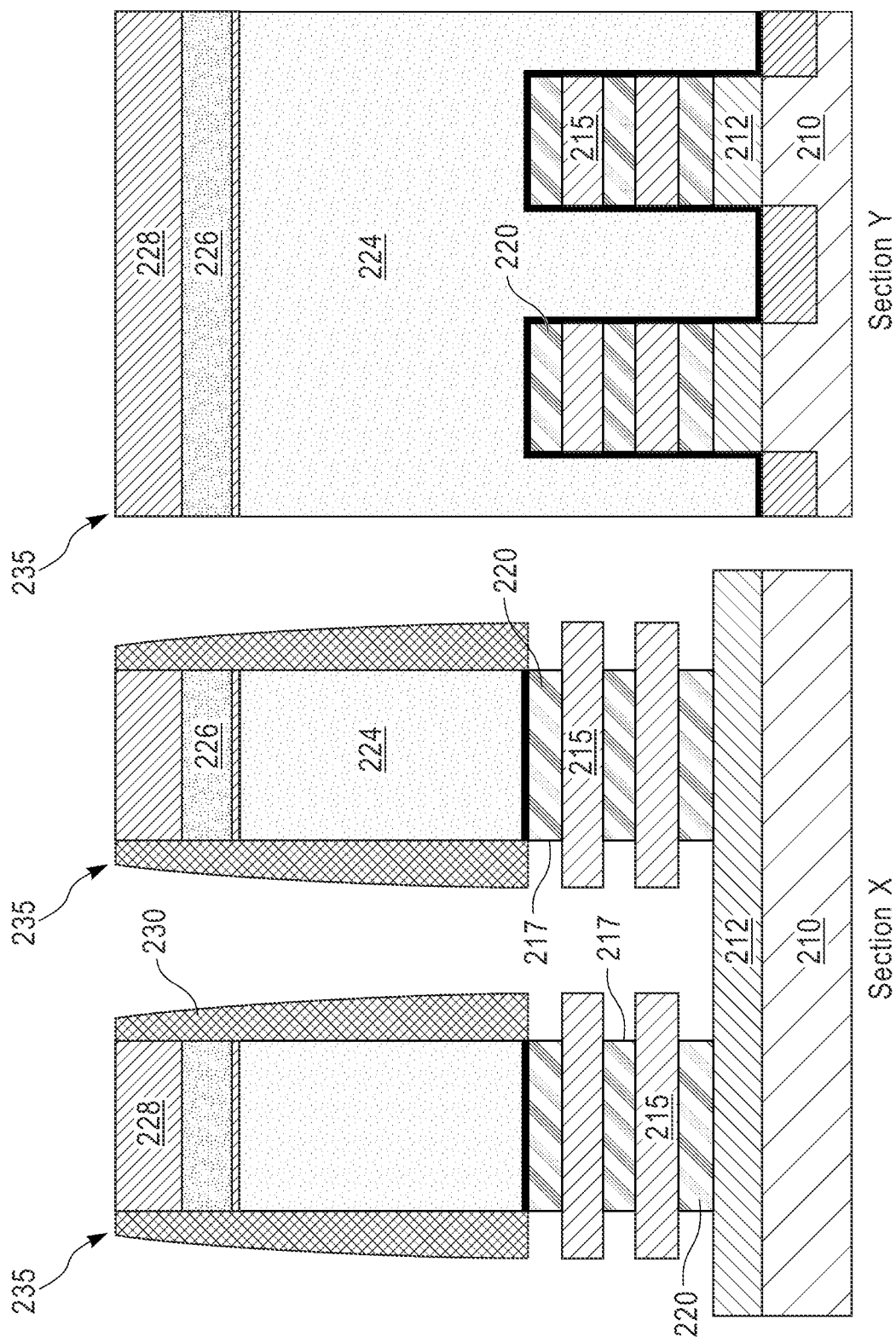

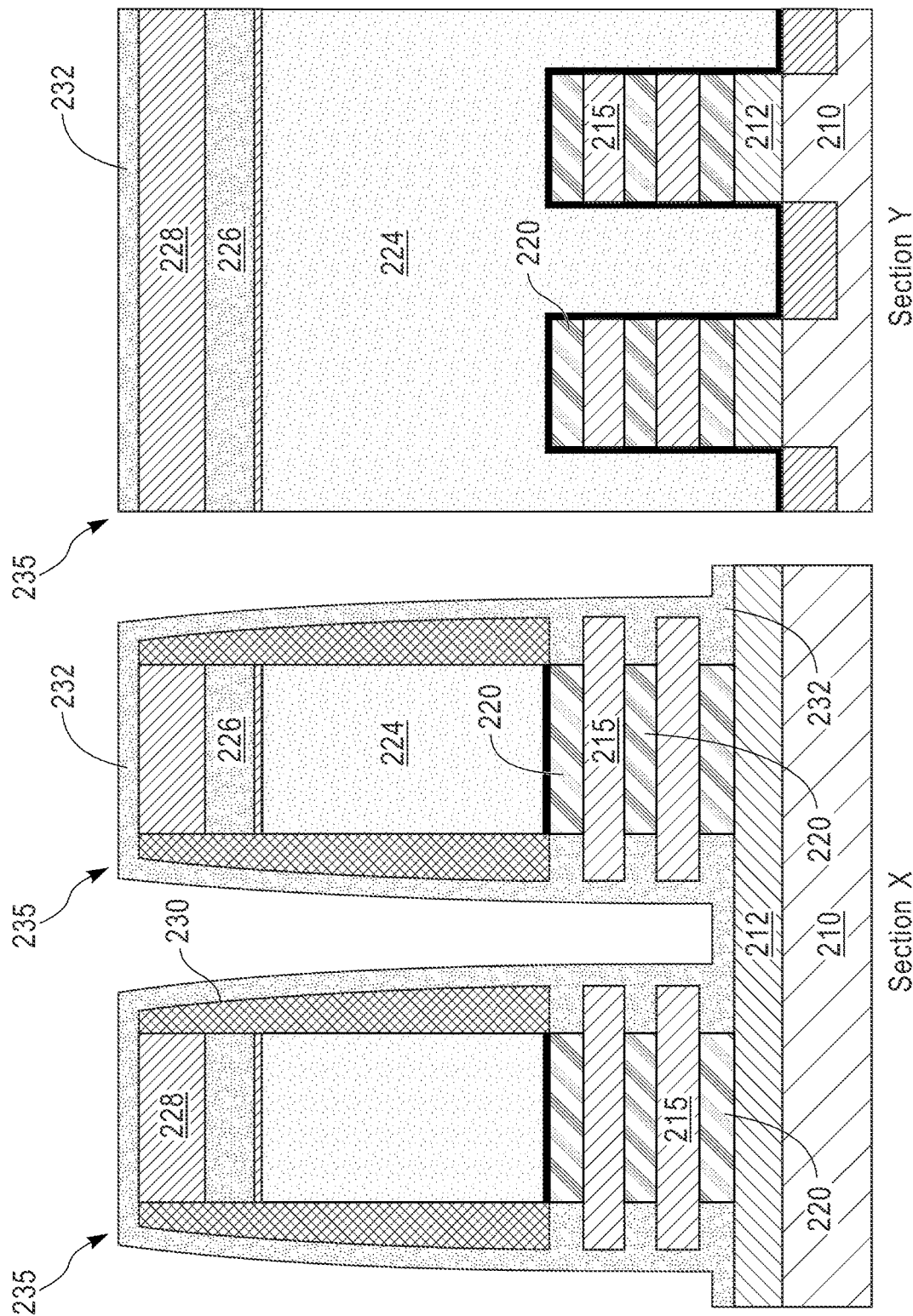

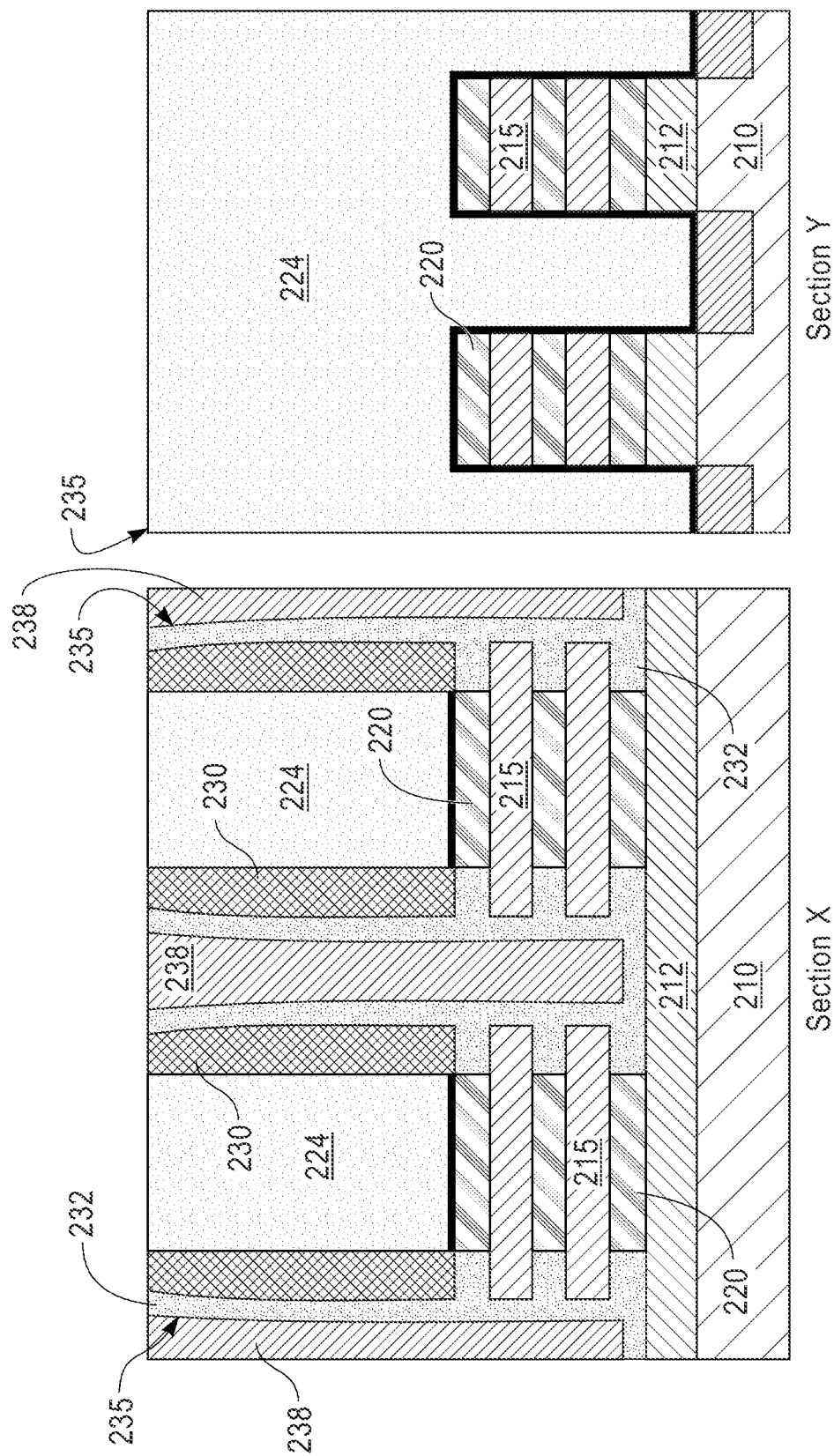

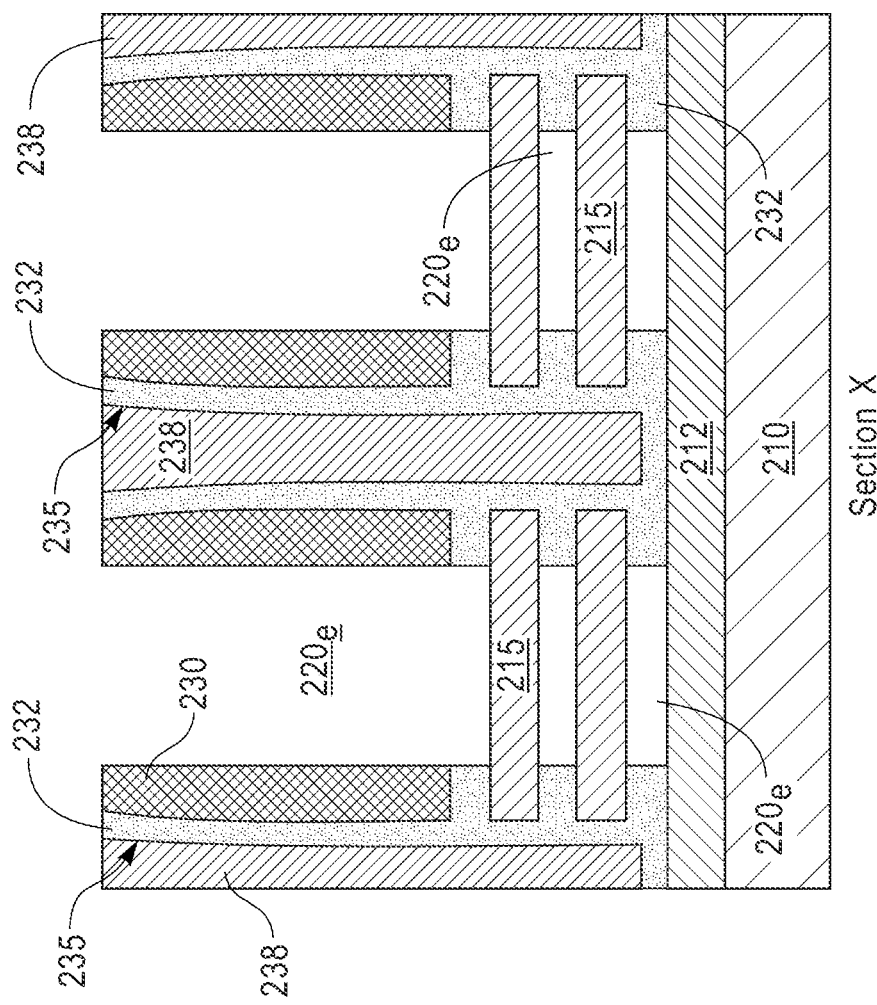
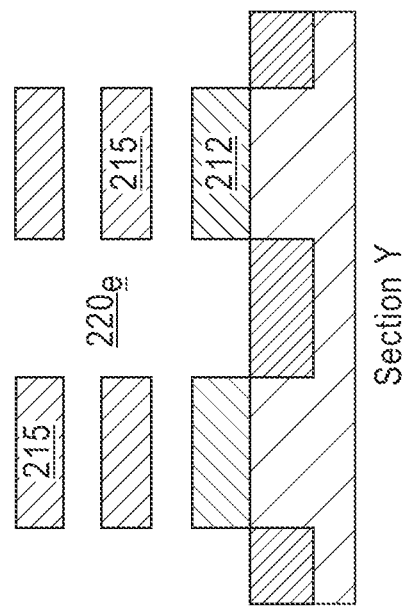
FIG. 11A
FIG. 11B

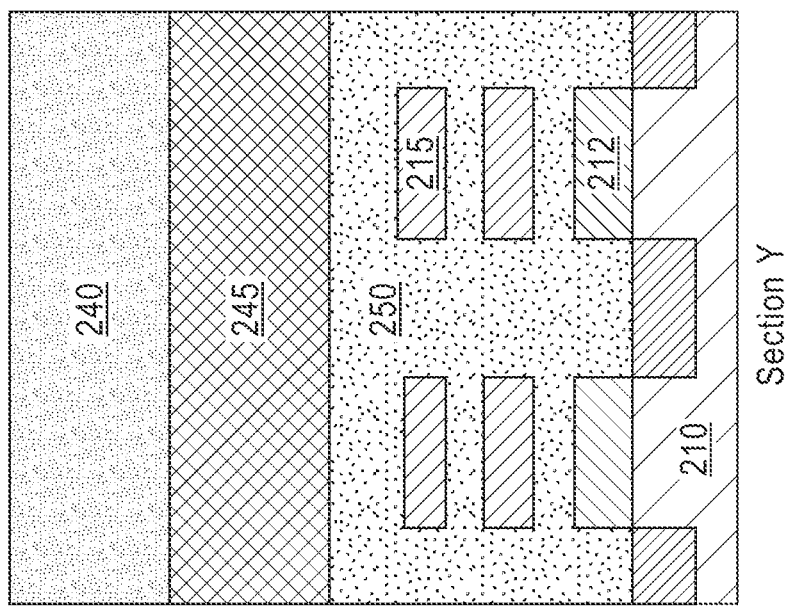
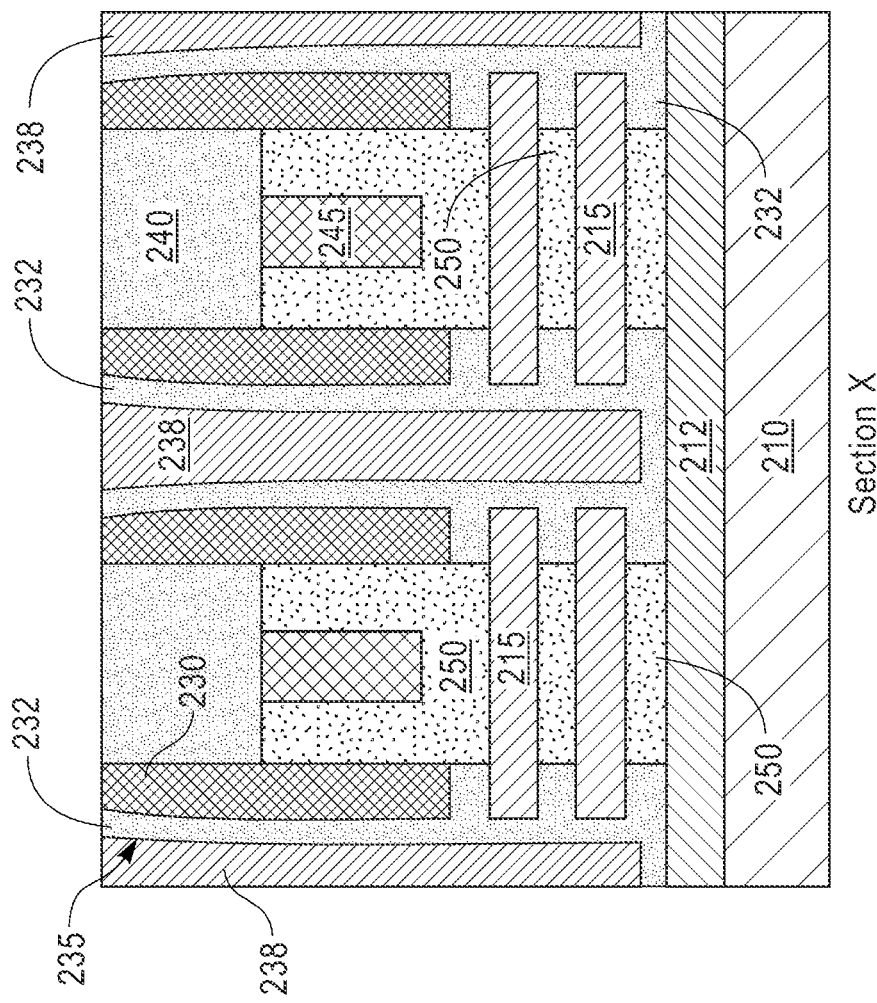
FIG. 12A
FIG. 12B

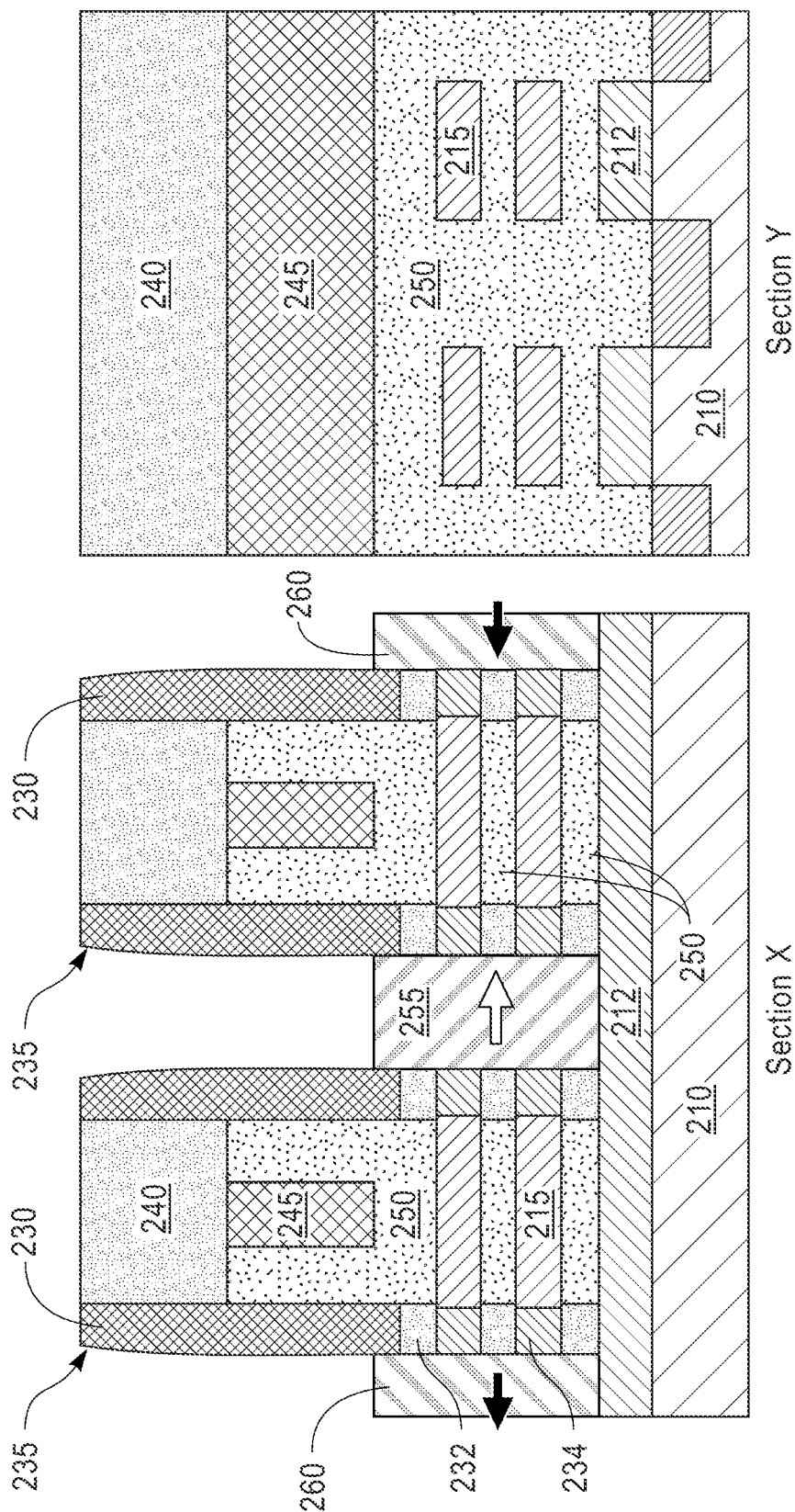
FIG. 14A  Section X
FIG. 14B  Section Y

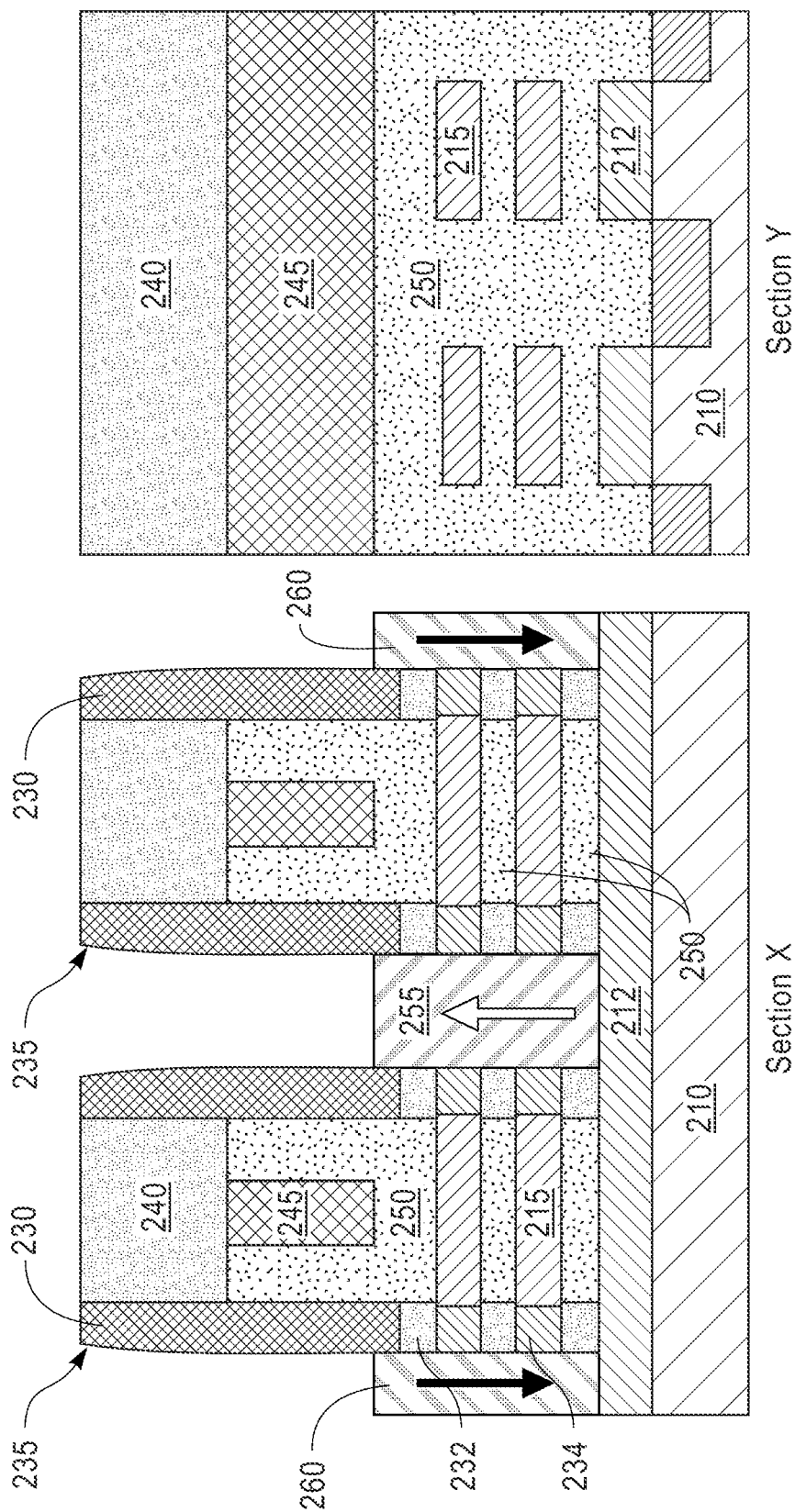
FIG. 15A  Section X
FIG. 15B  Section Y

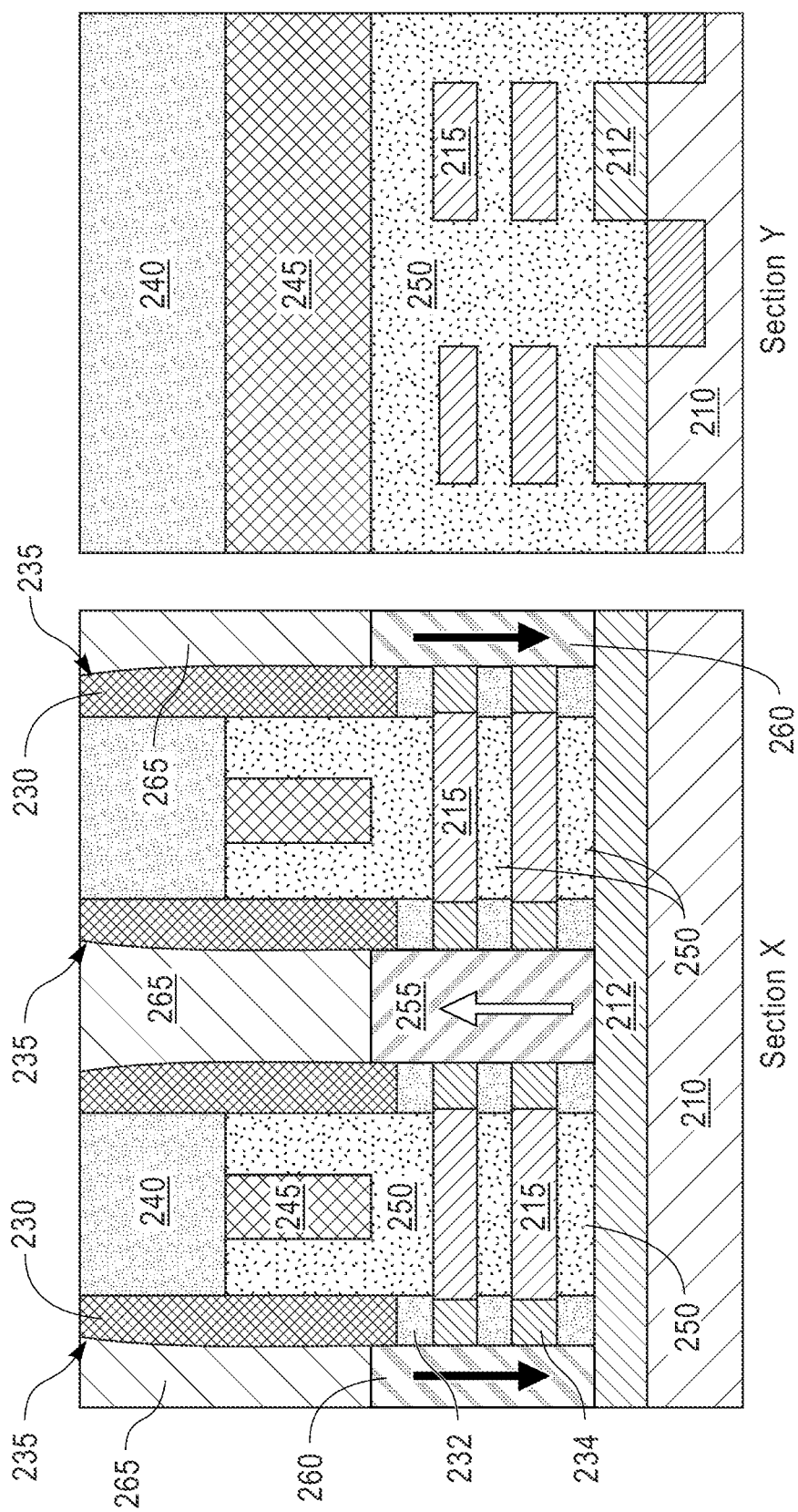

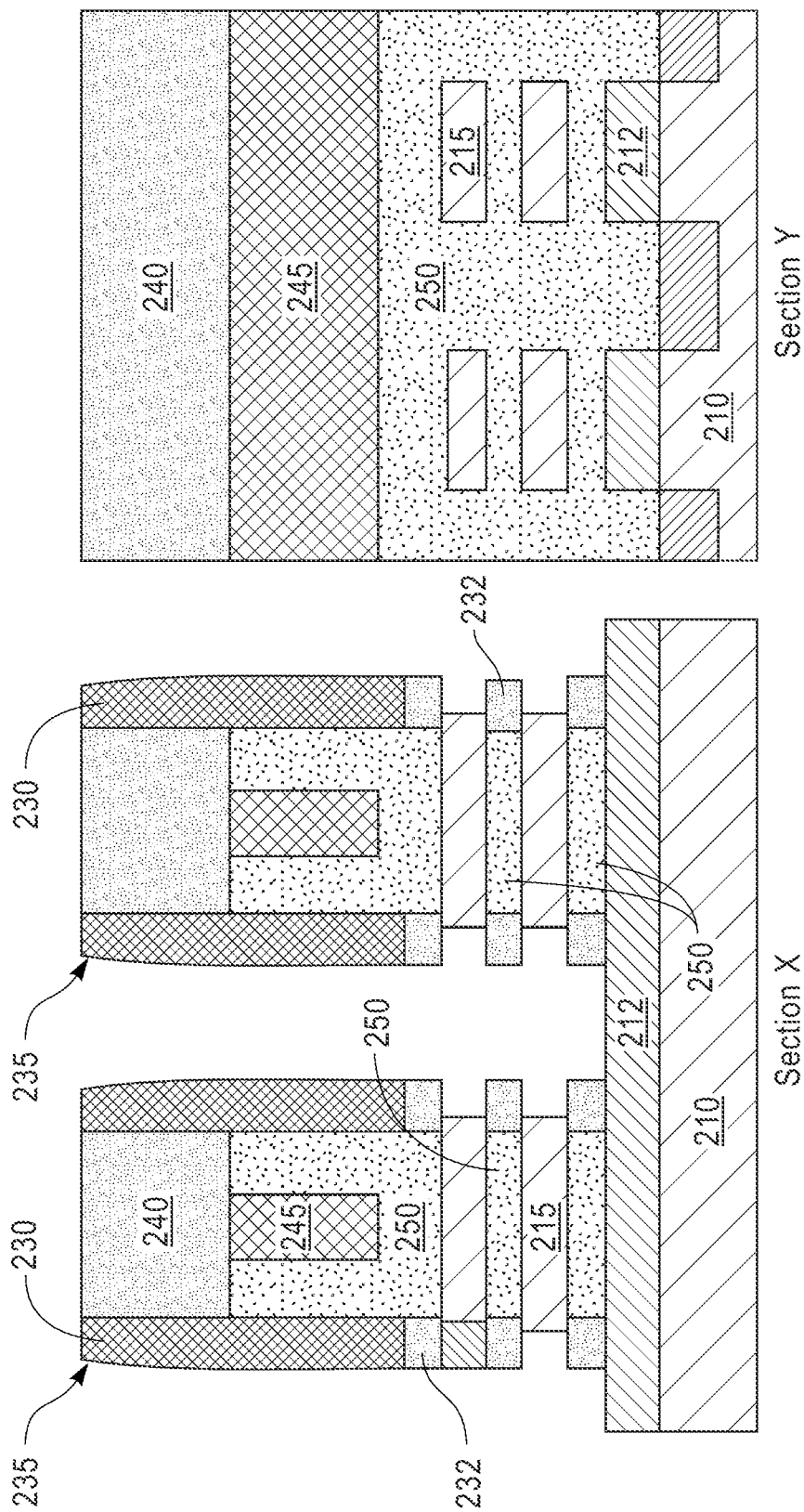

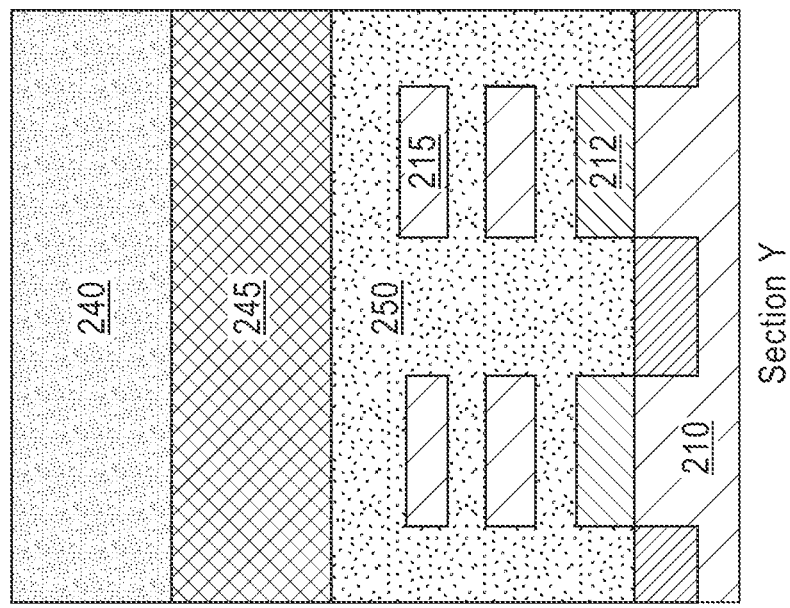
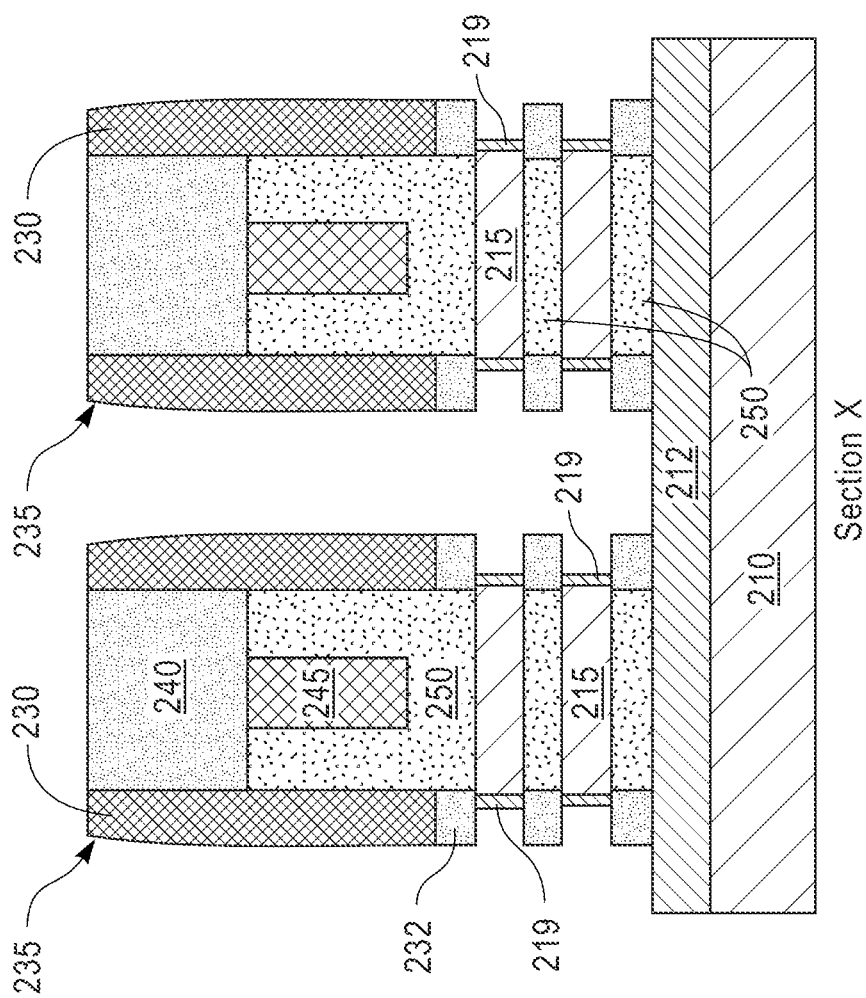
FIG. 18B
FIG. 18A

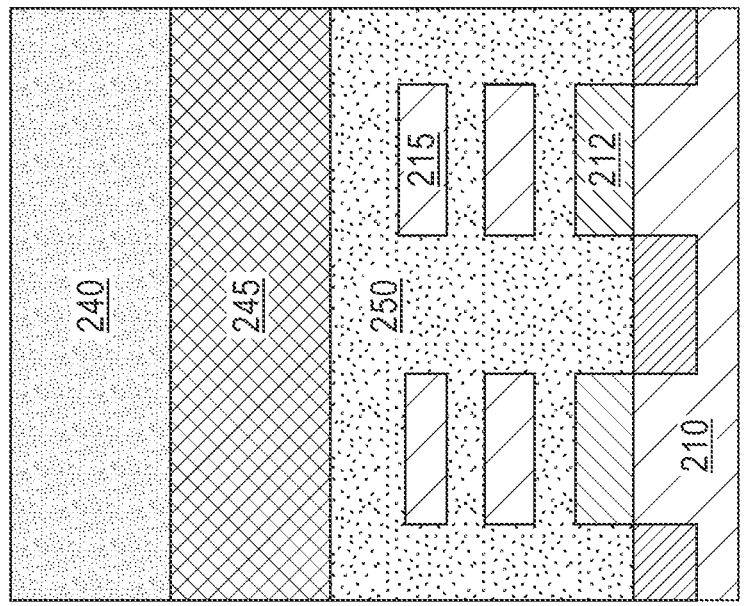
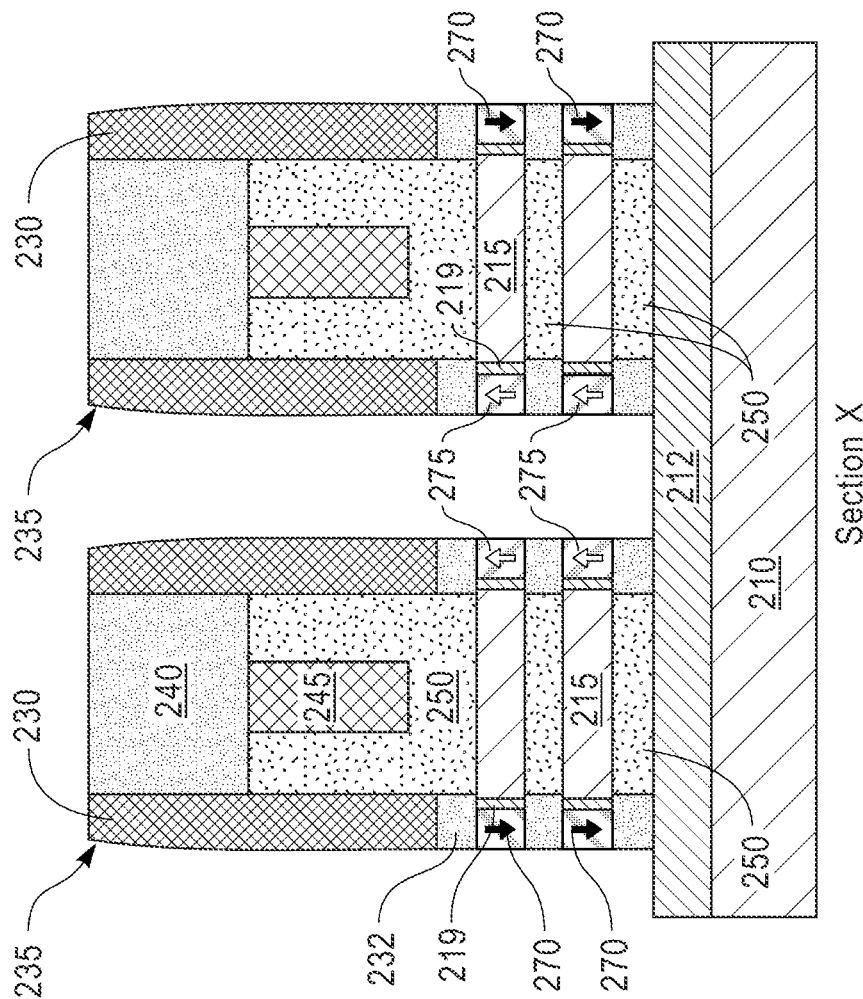
FIG. 20A
FIG. 20B

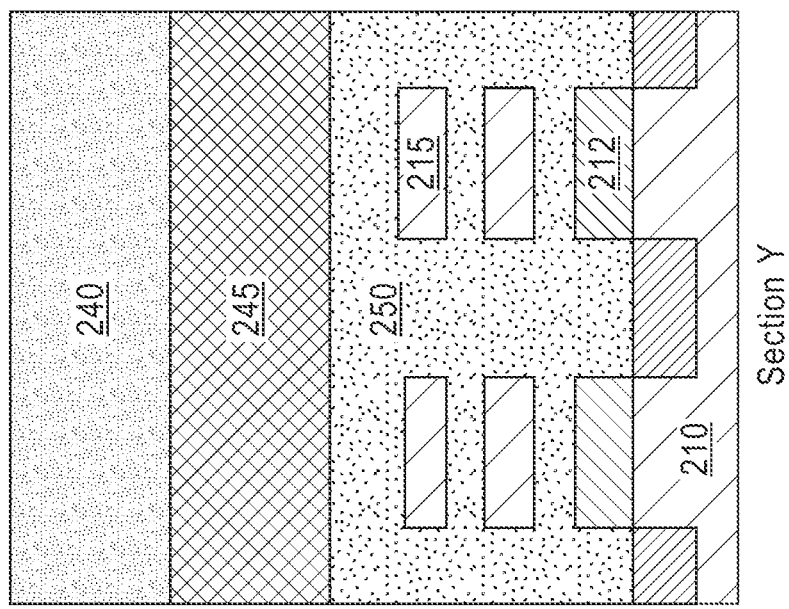
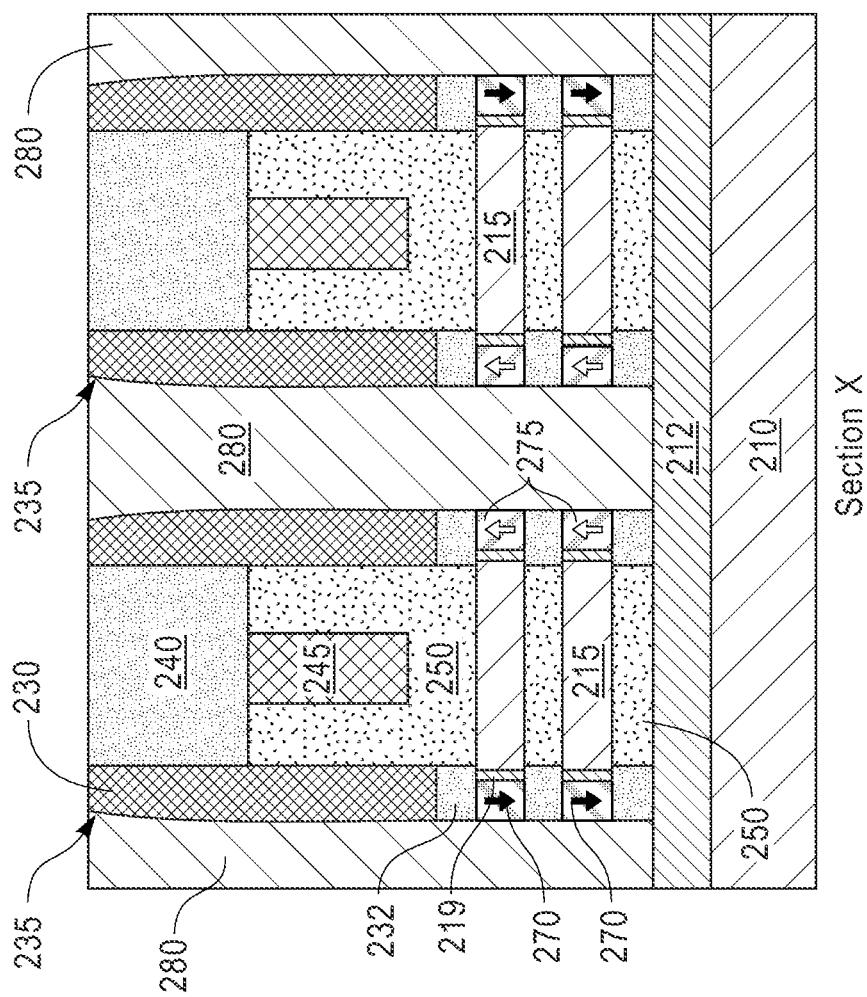
FIG. 21A
FIG. 21B

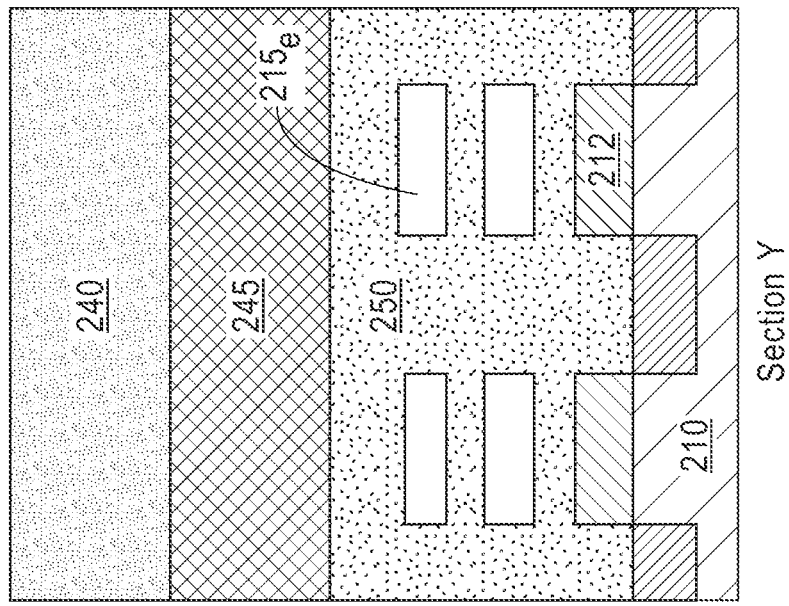
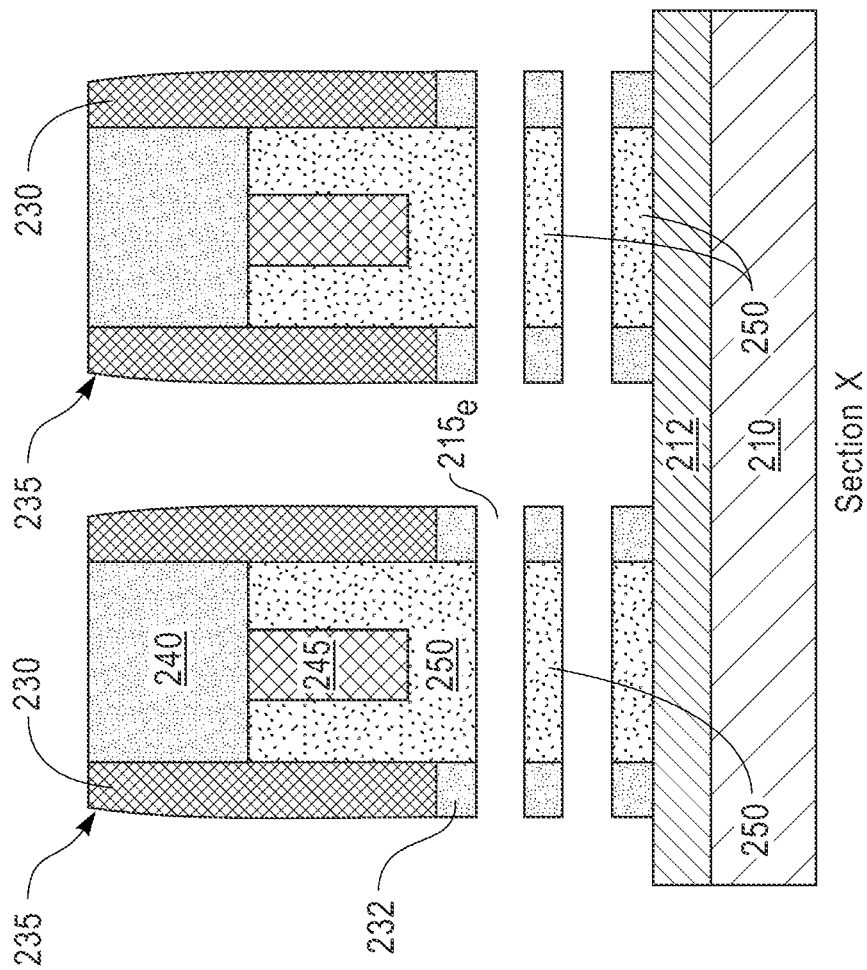
FIG. 24B
FIG. 24A

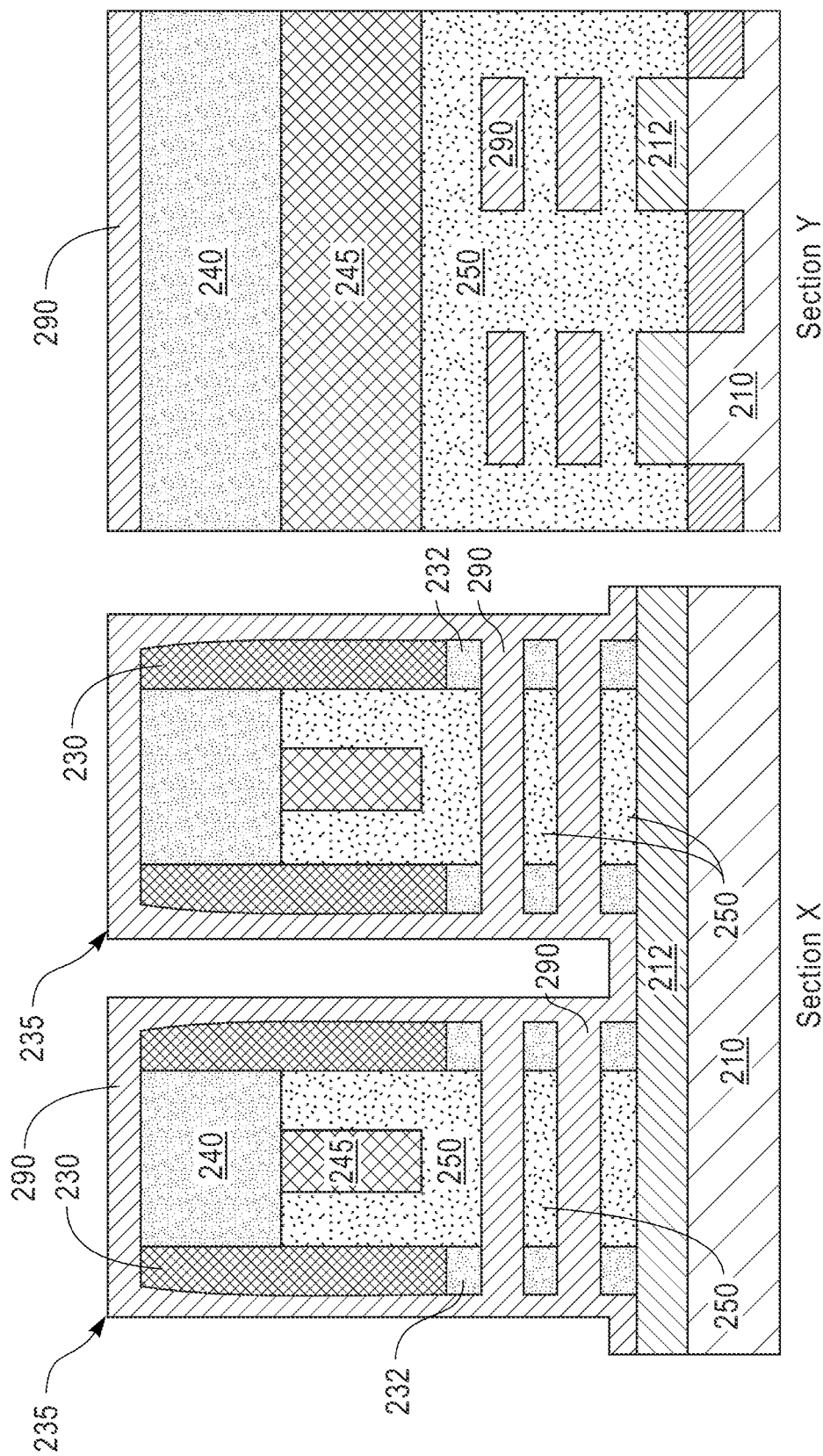
FIG. 25A Section X
FIG. 25B Section Y

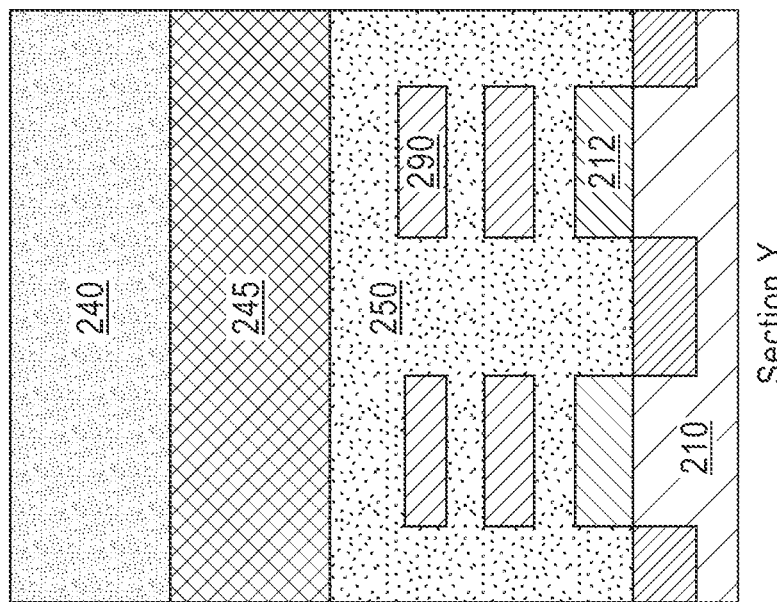
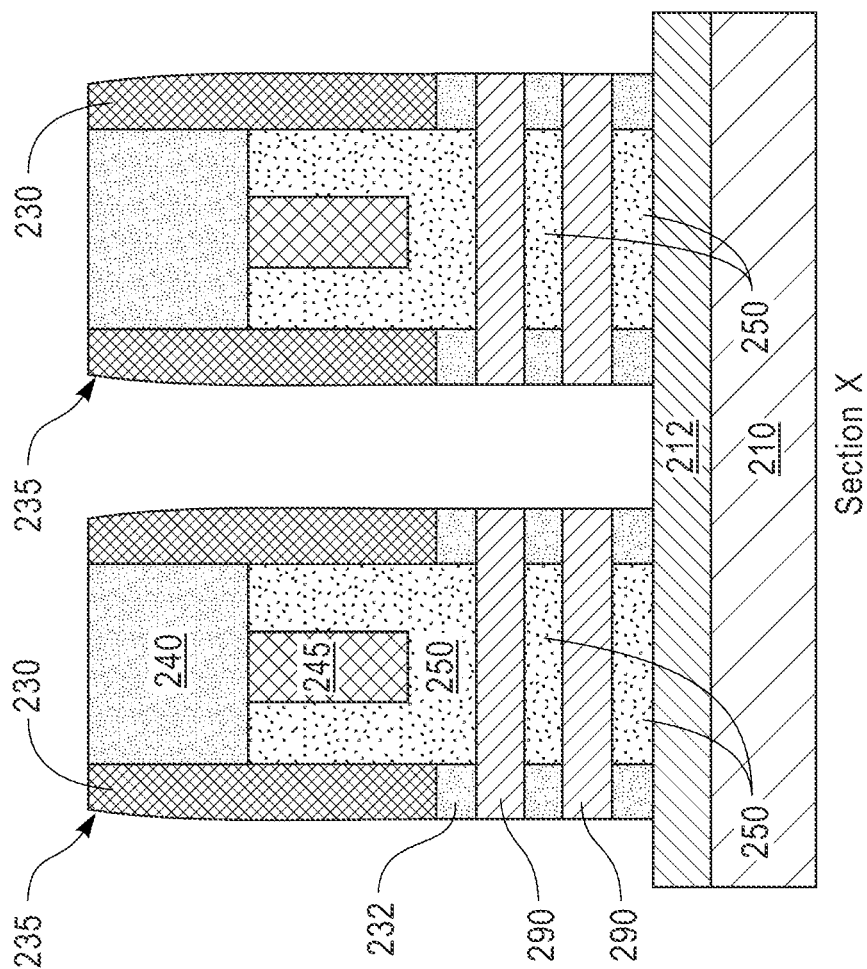
FIG. 26B
FIG. 26A

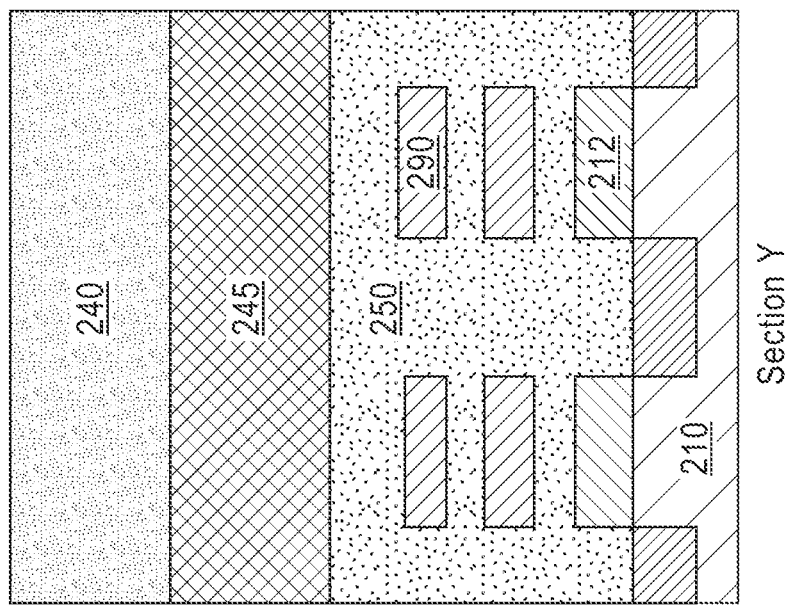
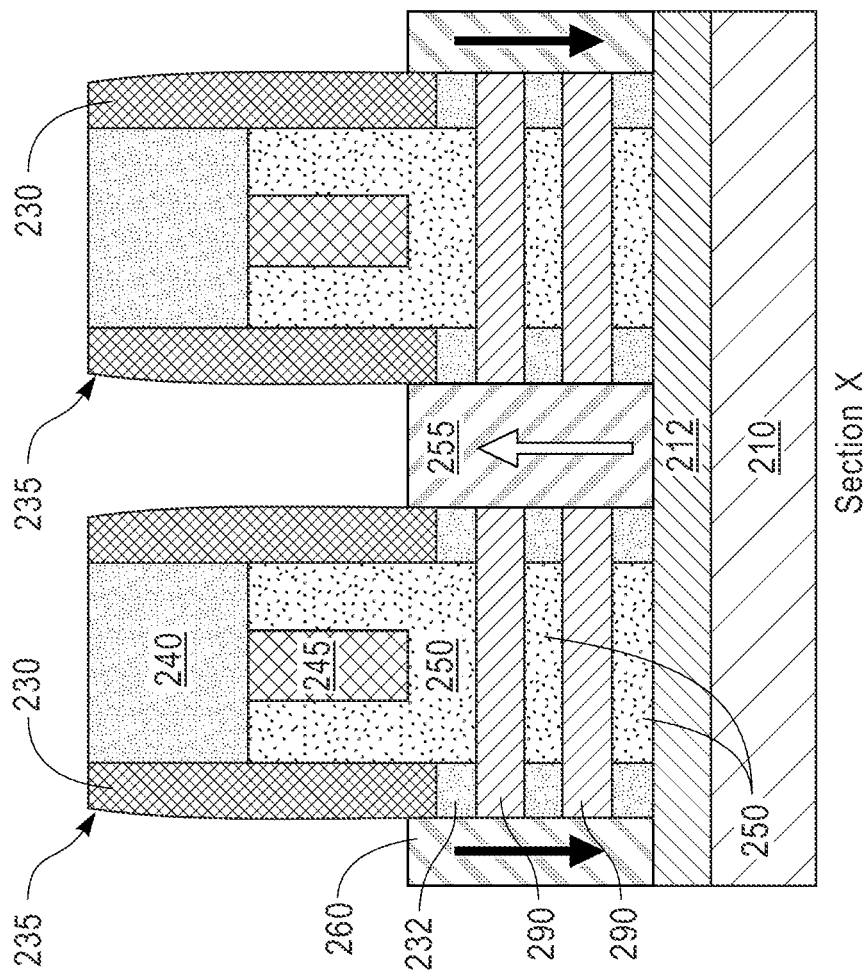
FIG. 28B
FIG. 28A

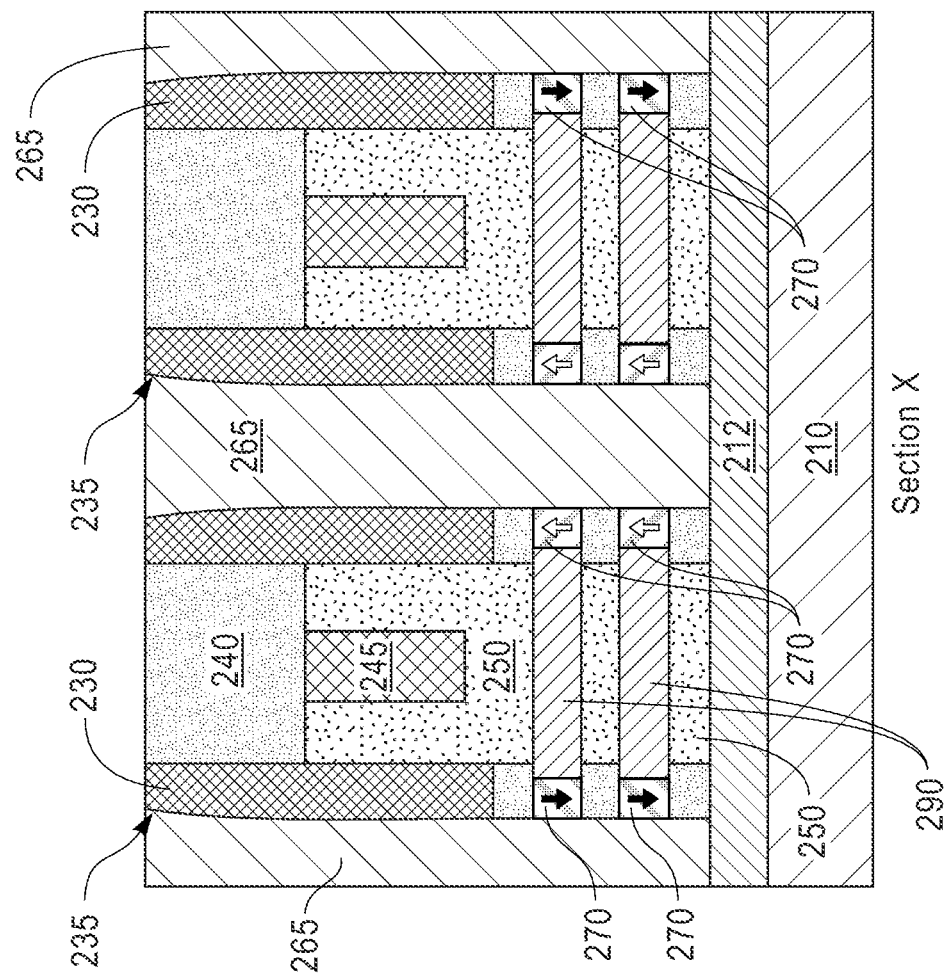
FIG. 30A  Section X
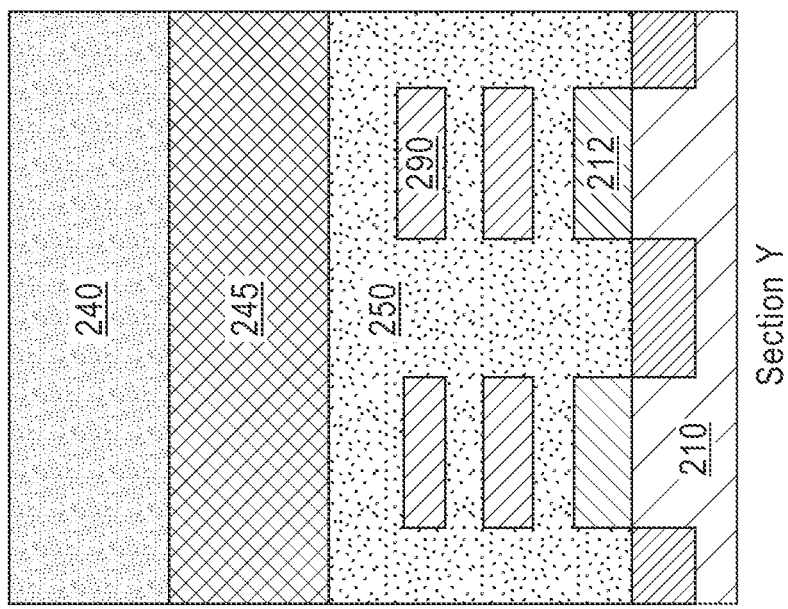
FIG. 30B  Section Y

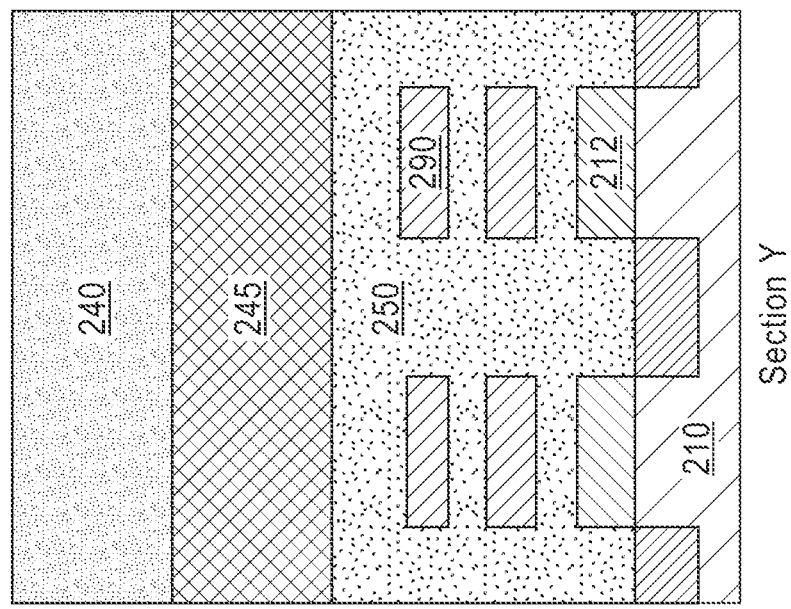
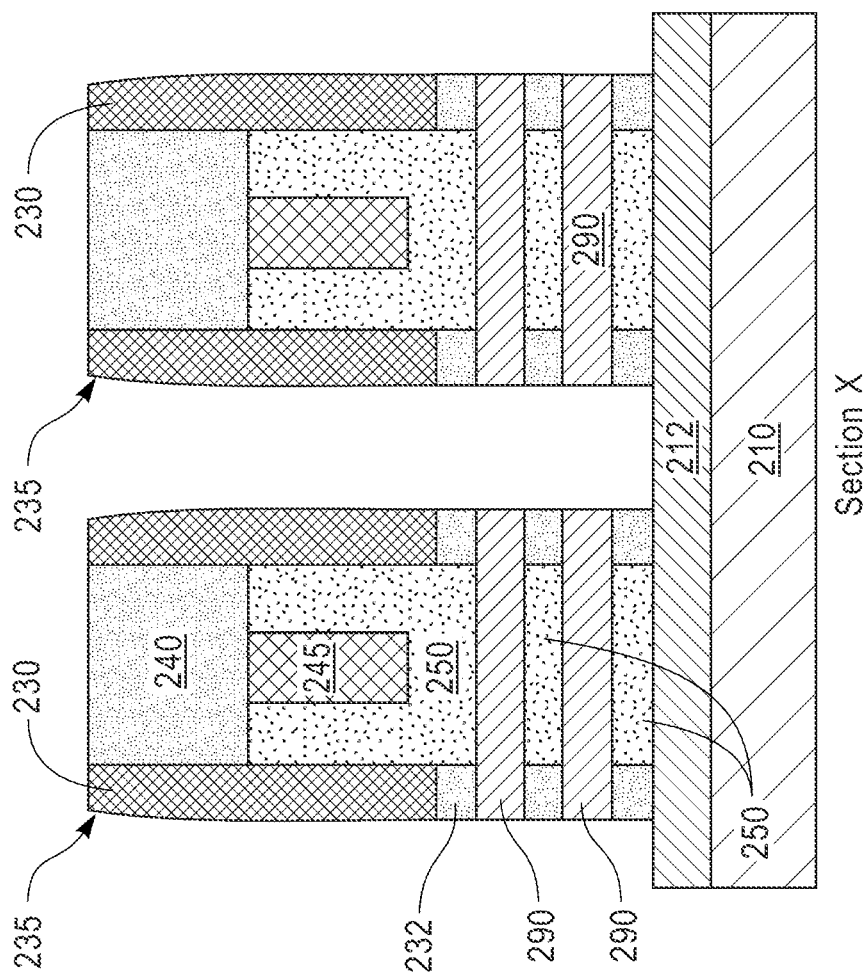
FIG. 31A  
FIG. 31B

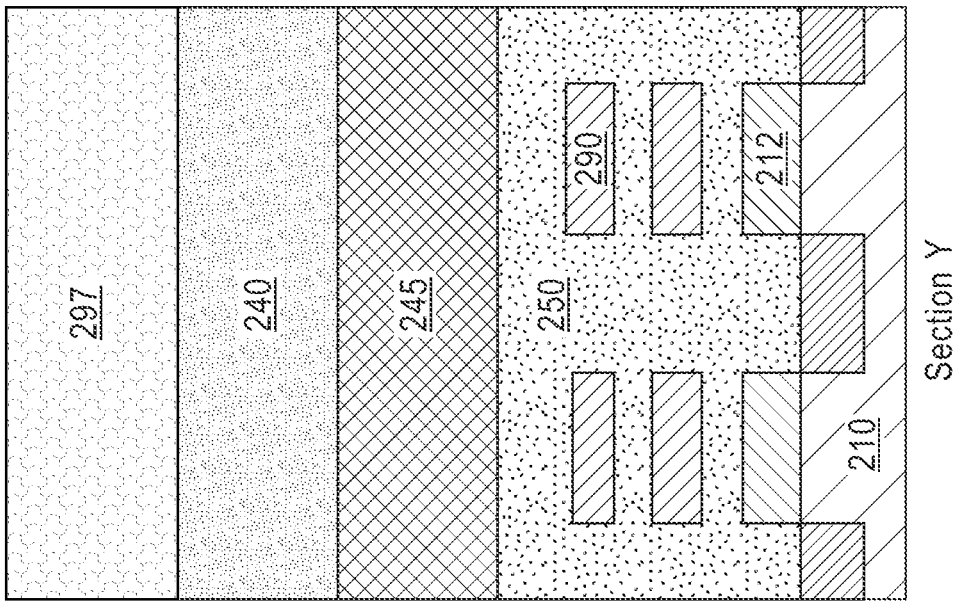
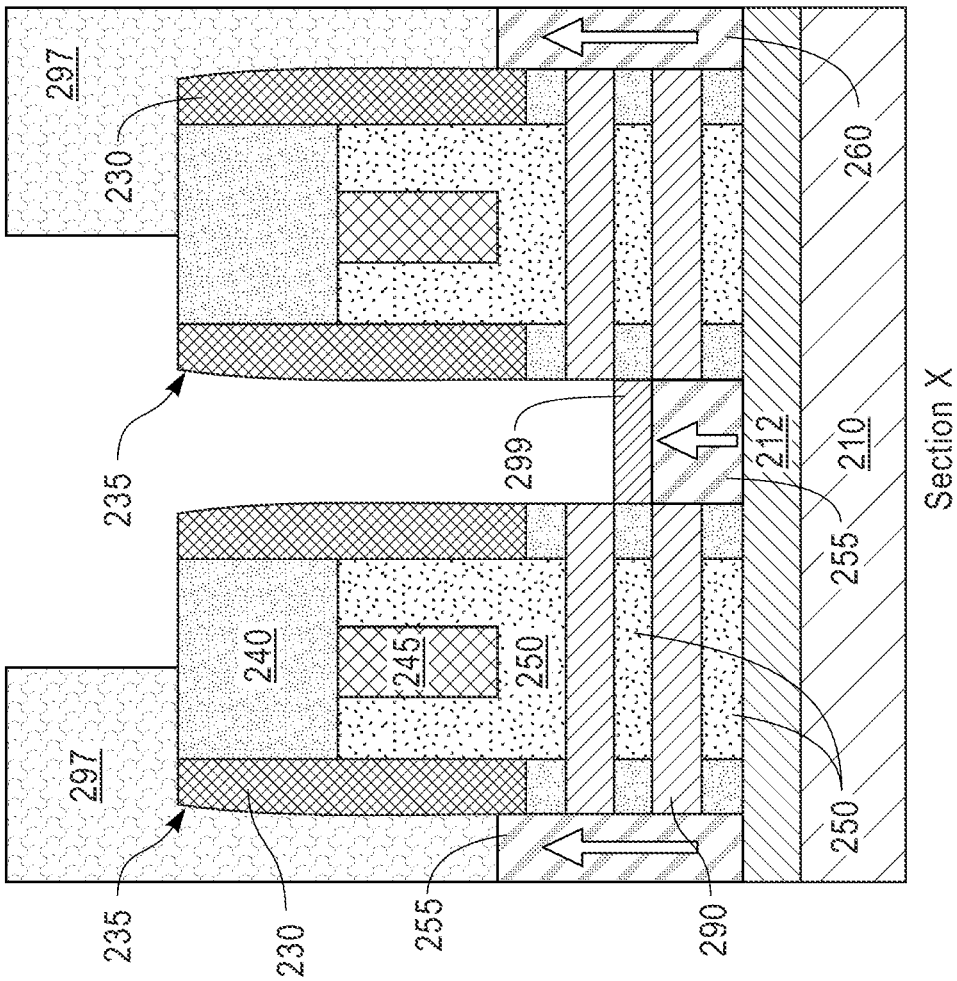
FIG. 34A
FIG. 34B

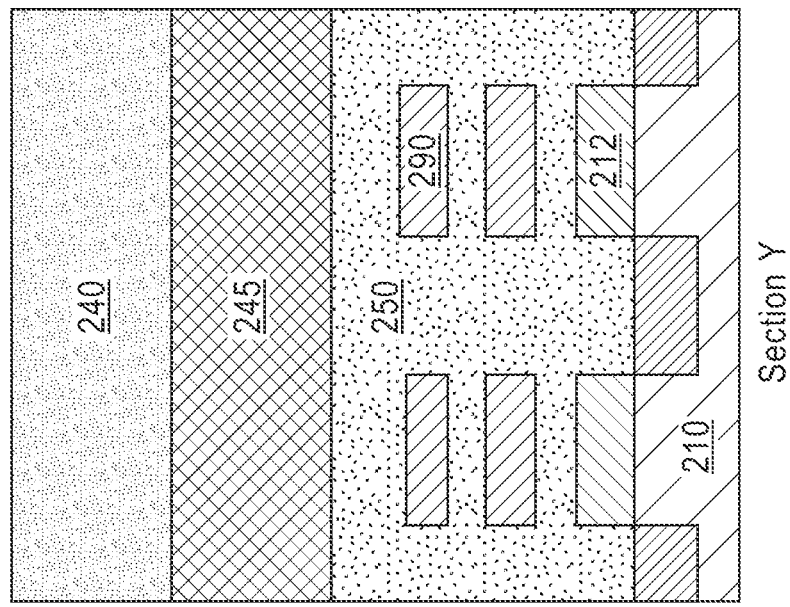
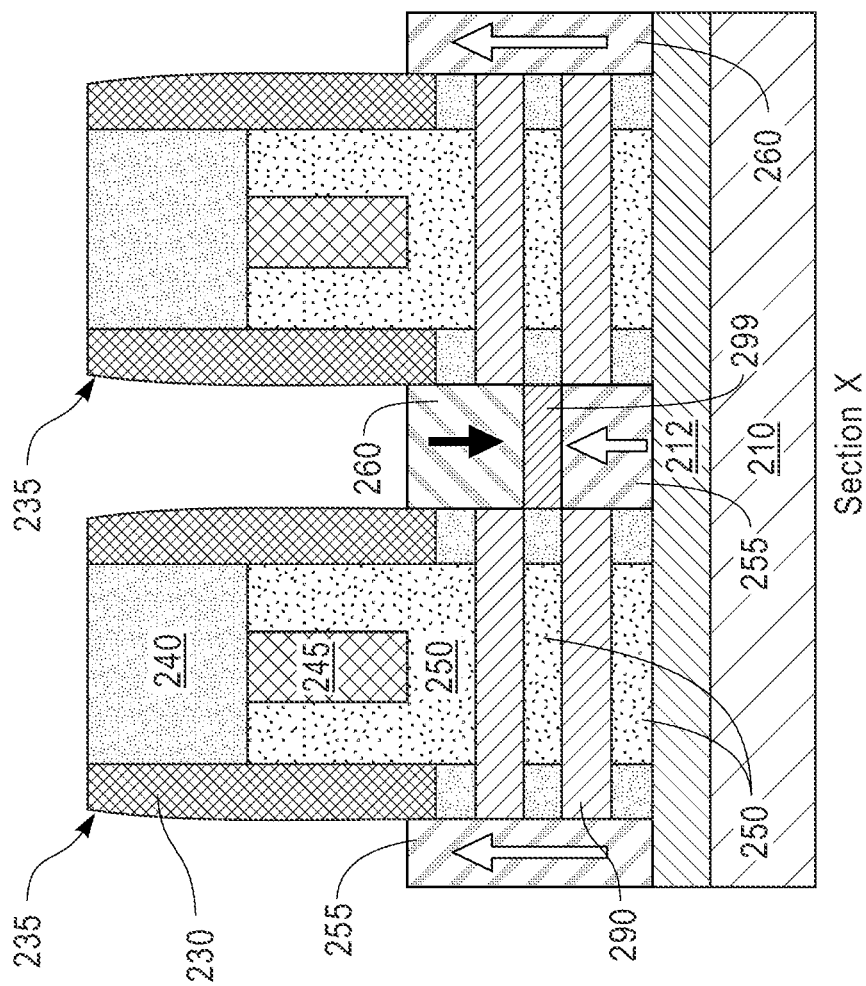
FIG. 35A
FIG. 35B

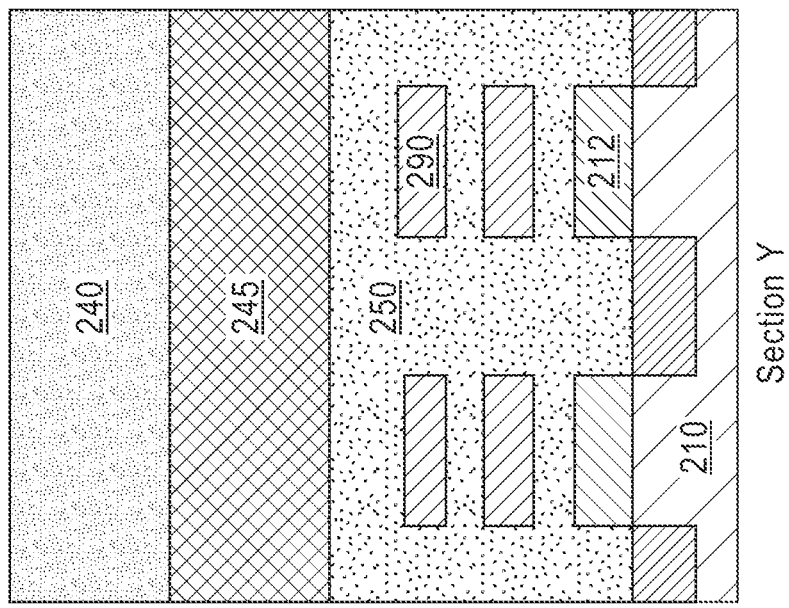
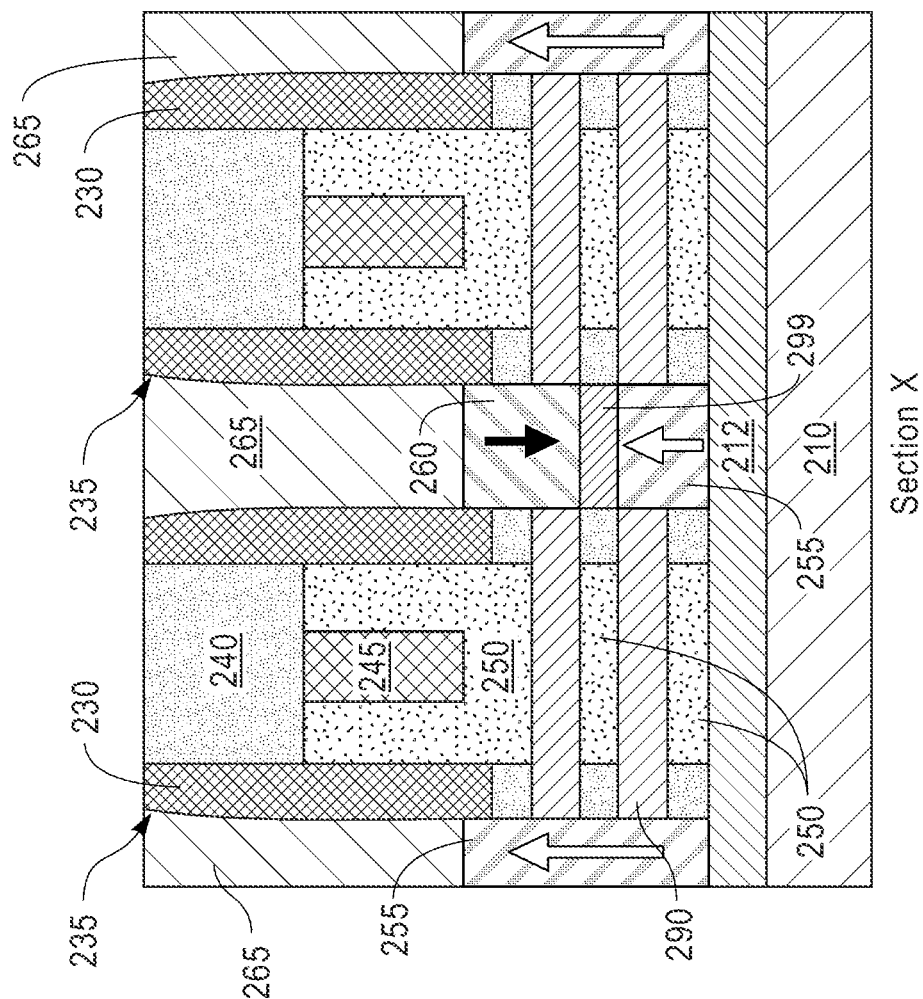
FIG. 36B
FIG. 36A

SPIN-BASED GATE-ALL-AROUND TRANSISTORS

BACKGROUND

The present disclosure generally relates to electrical devices, and more particularly, to spin-based gate-all-around transistors for beyond-complementary metal-oxide-semiconductor logic and memory.

Spintronics describes a paradigm where the information is carried by the electron spin instead of its charge like in mainstream electronics. Using the information carried by electron spin offers opportunities for a new generation of devices combining standard microelectronics with spin-dependent effects arising from the interaction between the electron spin and the magnetic properties of the material. Active spintronic devices such as Spin Field-Effect-Transistors (Spin-FET) are one of the considered options for the post-CMOS era.

Spin-FET devices do not strictly rely on the raising or lowering of electrostatic barriers in the channel region and can overcome scaling limits of conventional charge-based transistors. Spin transport in semiconductors may also lead to dissipation-less information transfer with pure spin currents. Adding the spin degree of freedom to conventional semiconductor charge-based electronics may add substantially more capability and performance to electronic products.

Spin-FET offer the potential of combining magnetic storage of information with electronic readout in a single device. Such devices may lead to computers in which the distinction between active and passive memory has been removed and in which the data is processed in the same part of memory in which it is stored.

The advantages of spin-based devices include being non-volatile, having increased data processing speed, having decreased electric power consumption and increased integration densities compared with conventional semiconductor devices.

SUMMARY

According to an embodiment of the present disclosure, a semiconductor chip device is provided. The semiconductor device includes a field effect transistor (FET) with at least one Gate-All-Around (GAA) channel. A first conductive ferromagnetic source/drain contacts are electrically connected with a first portion of the GAA channel. A second conductive ferromagnetic source/drain contacts are electrically connected with a second portion of the GAA channel. A remanent magnetization of the first conductive ferromagnetic source/drain contacts is oriented in a direction opposite to a remanent magnetization of the second conductive ferromagnetic source/drain contacts. In addition, the GAA channel extends between the first conductive ferromagnetic source/drain contacts and the second conductive ferromagnetic source/drain contacts.

According to an embodiment of the present disclosure, a semiconductor chip device is provided. The semiconductor device includes a field effect transistor (FET) including at least two vertically stacked Gate-All-Around (GAA) channels, including a top channel and a bottom channel. A first conductive ferromagnetic contact is electrically connected to a first portion of the top channel and a first portion of the bottom channel. A second conductive ferromagnetic contact is electrically connected to a second portion of the bottom channel. A third conductive ferromagnetic contact is electrically connected to a second portion of the top channel. The second and third conductive ferromagnetic source/drain contacts are isolated by a dielectric. A remanent magnetization of the first conductive ferromagnetic source/drain contact is oriented in a same direction as a remanent magnetization of one of the second conductive ferromagnetic source/drain contact or the third conductive ferromagnetic source/drain contact. A remanent magnetization of the second conductive ferromagnetic source/drain contact is oriented in a direction opposite the remanent magnetization of the third conductive ferromagnetic source/drain contact.

According to an embodiment of the present disclosure, a method of manufacturing a semiconductor device is provided. The method includes forming a stack of nanosheets on a substrate. The stack includes alternating layers of a first material and of a second material. A plurality of fin structures are formed on the stack of nanosheets. The fin structures include a silicon nitride layer and an inner spacer liner. A shallow trench isolation (STI) structure if formed between the fin structures and into the stack of nanosheets. Cavities for a dummy gate, a gate spacer and a source-drain are formed in areas of the stack of nanosheets, between the fin structures. The layers of the second material are indented to form inner spacer cavities. An inter-layer dielectric is deposited between two or more of the fin structures. The dummy gate and the layers of the second material are selectively removed from the fin structures, leaving the layers of the first material from the nanosheets behind as channels for electron conduction. Ferromagnetic contacts are formed in the open regions, and in contact with the silicon layers. Trench metal contacts are formed on top of the ferromagnetic contacts.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 6A-6B show views showing formation of nanosheet fins, according to an embodiment.

FIGS. 7A-7B show views of forming recesses, shallow trench isolation, and a dummy gate, according to an embodiment.

FIGS. 8A-8B show views of indenting a silicon germanium suspension material, according to an embodiment.

FIGS. 9A-9B show views forming an inner spacer with a conformal liner, according to an embodiment.

FIGS. 10A-10B show views of filling spaces with an inter-layer dielectric followed by planarization, according to an embodiment.

FIGS. 11A-11B show views of selectively removing the dummy gate and selective release of silicon germanium layers, according to an embodiment.

FIGS. 12A-12B show views forming a high-k metal gate stack, according to an embodiment.

FIGS. 14A-14B show views forming ferromagnetic contacts, according to an embodiment.

FIGS. 15A-15B show views consistent with the views of FIGS. 14A and 14B but with an alternate ferromagnetic configuration, according to an embodiment.

FIGS. 16A-16B show views forming metal contacts, according to an embodiment.

FIGS. 17A-17B show views of recessing conductor channel sheets, according to an embodiment.

FIGS. 18A-18B show views of plasma doping of conductor channels, according to an embodiment.

FIGS. 20A-20B show views consistent with the views of FIGS. 19A and 19B but with an alternate ferromagnetic configuration, according to an embodiment.

FIGS. 21A-21B show views forming metal contacts, according to an embodiment.

FIGS. 24A-24B show views of selective stripping of silicon and inter-level dielectric from the gate stack, according to an embodiment.

FIGS. 25A-25B show views of depositing high spin orbit material into conductor channels, according to an embodiment.

FIGS. 26A-26B show views of isotropic recessing of high spin orbit material, according to an embodiment.

FIGS. 28A-28B show views forming ferromagnetic contacts with an alternate magnetic configuration, according to an embodiment, according to an embodiment.

FIGS. 30A-30B show views consistent with the views of FIGS. 22A and 22B, except with a different channel material, according to an embodiment.

FIGS. 31A-31B show views consistent with the views of FIGS. 26A and 26B in preparation for forming a spin-based gate-all-around inverter, according to an embodiment.

FIGS. 34A-34B show views forming a spacer, according to an embodiment, according to an embodiment.

FIGS. 35A-35B show views forming a second type of ferromagnetic contact, according to an embodiment, according to an embodiment.

FIGS. 36A-36B show views forming metal contacts, according to an embodiment, according to an embodiment.

DETAILED DESCRIPTION

Overview

Figure 1:
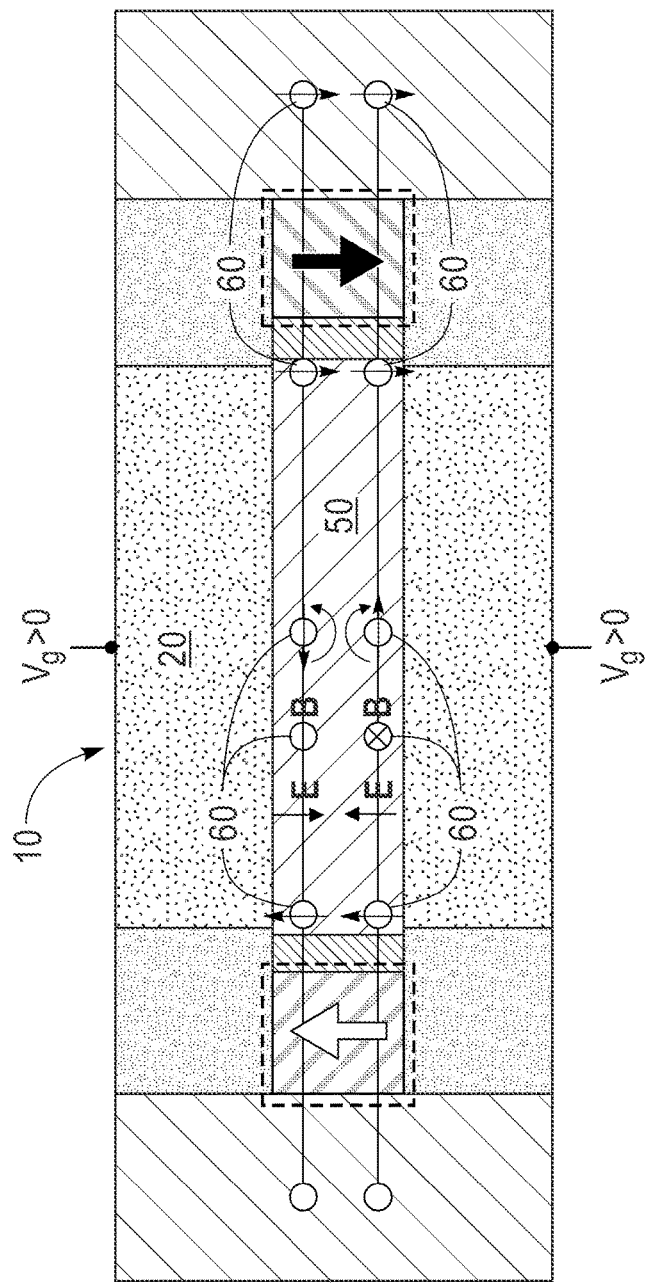
FIG. 1 is a diagrammatic of a spin-based semiconductor device consistent with embodiments of the present disclosure.

In general, embodiments in the disclosure provide a spin-based field effect transistor (FET). A spin-based FET will provide additional logic state programming in circuits among other benefits. Embodiments generally include a gate structure that is formed using a vertical stack of nanosheets. By using vertically stacked nanosheet structures, a wide variety of channels structure become possible in the gating region of the device. Referring now to FIG. 1, a cross-sectional view of a spin-based FET device 10 is shown consistent with embodiments of the disclosure. In a spin-FET, spin-polarized electrons 60 are injected from a ferromagnetic source 15 into a semiconductor channel 50 (controlled by a gate 20) and detected using a ferromagnetic drain electrode 70. The magnetic orientation of an electron's spin may be used as signal states to register as data output (ON/OFF with different kinds of each state being a possibility). For example, electrons exhibiting polarities opposite from the drain polarity may register a high resistance (no signal). High and low resistance can be used to indicate signal or no signal bits. Some embodiments incorporate a gate-all-around (GAA) type of FET (also known as a surrounding-gate transistor), which has multiple gates and channel outputs. The number of output bits possible when combining a GAA with spin-based structures scales with the number of channels stacked and well exceeds the performance output of a conventional FET device. In the following disclosure, various embodiments of a spin-based FET are described. The examples provided are not exhaustive of the variations that are within the scope of the disclosure, however, for sake of brevity, a selected number are provided for the reader to understand how nanosheet complementary devices may be formed to provide different programmable outputs using spin-based FETs.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures.

For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other directions) and the spatially relative descriptors used herein should be interpreted accordingly. A "top-most" element refers to the element that is highest or first in a stack or other vertical arrangement. Sometimes being the "top-most" refers to an element closest to a top boundary such as the top surface of a device. Similarly, "bottom-most" may refer to the element lowest or last in a vertical arrangement. Sometimes being the "bottom-most" refers to an element closest to a bottom boundary such as a substrate or bottom surface of the device.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Device Structure

Figure 2:
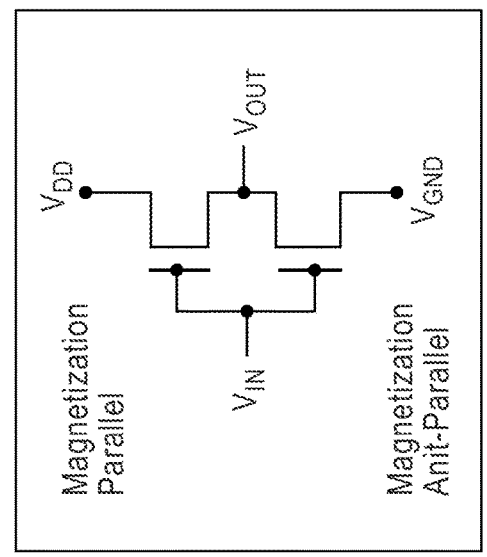
FIG. 2 is a schematic view of an electrical circuit consistent with embodiments of the present disclosure.
Figure 3:
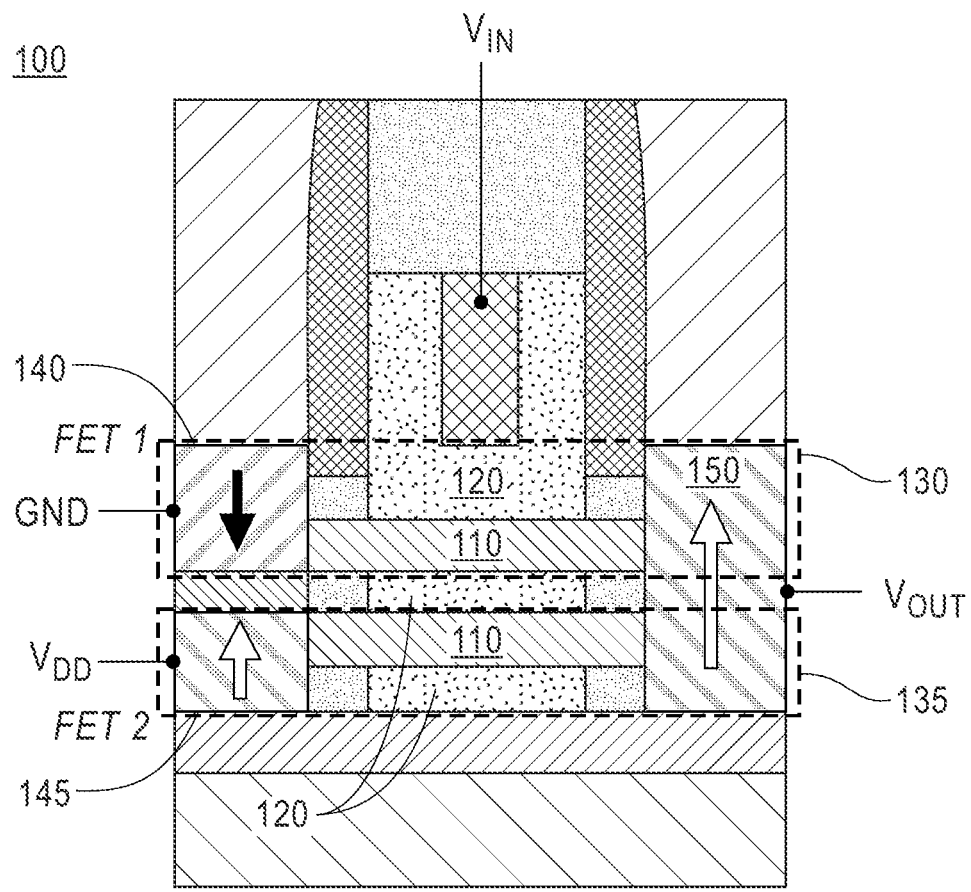
FIG. 3 is a cross-sectional view of a spin-based inverter accompanied by a truth table of states, according to embodiments.

FIG. 2 shows a diagram of an electrical schematic for one type of spin-FET based inverter. The diagram represents a spin-inverter circuit structure that becomes possible under the technology disclosed herein. FIG. 3 shows a cross-sectional view of a spin-inverter structure based on spin-FET 100 (sometimes referred to as the "device 100") according to an embodiment. Some embodiments may be a spin-based gate-all-around (GAA) FET. Some embodiments may be a spin-based gate-all-around inverter. Embodiments generally use stacked nanosheet channels to form the GAA FET. The type of material stacked between layers of a gate metal is selected to produce a known state in the output of carriers, for example, electrons travelling through the GAA.

In a spin-FET inverter device 100 of the subject disclosure, there are at least two spin-FETs (130 and 135) vertically stacked and coupled to the gate 120. The first, top spin-FET 130 may have an anti-parallel magnetization configuration. In an anti-parallel configuration, the source and drain have remanent magnetization pointing in opposite directions. For example, on the source side of the device 100, the spin-FET 130 includes a ferromagnetic contact (spin injector) 140 with a remanent magnetization orientation that is opposite in polarity from the remanent magnetization orientation of the ferromagnetic contact 150 on the drain side.

The second, spin-FET 135 may have a parallel magnetization configuration. On the source side, the spin-FET 135 may have a ferromagnetic contact 145 with the same remanent magnetization orientation as the ferromagnetic contact 150 on the drain side. In some embodiments, the ferromagnetic contact 150 is a single body shared by the spin-FETs 130 and 135. It will be understood that the magnetization orientation for any of the ferromagnetic contacts may be different and selected based on the desired electrons spin-injection/detection geometry relative to the channel interfaces of the device 100. For example, the magnetization orientation of the ferromagnetic spin-injector and ferromagnetic spin-detector can both be in-plane (parallel) or out-of-plane (perpendicular) relative to the channel interfaces.

Physical Mechanism and Operating Principle:

In materials with spatial inversion asymmetry, an internal electric field can be present giving rise to spin-orbit interaction. It has been demonstrated in the art that this can lead to spin-momentum locking and spin-split sub-bands in systems with broken spatial inversion symmetry along a given axis. Hence, when electrons pass through such a material, they experience the effect of the internal electric field in the form of an effective magnetic field called the Rashba field. This causes the spins to precess around the direction of the Rashba field. The spin precession generated can be functionalized to manipulate the spin of electrical carriers travelling through the material with spatial inversion asymmetry.

In a spin-FET of the subject disclosure, spin-polarized electrons enter the channel through the ferromagnetic source contact. In the channel exhibiting spatial inversion asymmetry orthogonal to the channel plane, the spin starts to precess in the spin-orbit magnetic field intrinsic to the material as the electrons propagate. Once the electrons reach the ferromagnetic drain contact, they will only be transmitted into this contact if their resulting spin-polarization aligns with the orientation of the spin-polarized contact (low resistance state, i.e., ON-state). In the opposite case they will be reflected (high resistance state, i.e., OFF-state). In a Spin-FET, the role of the applied gate voltage is to tune the electron density in the channel, and thereby the strength of the Rashba spin-orbit coupling, i.e., the strength of the intrinsic spin-orbit Rashba magnetic field. The applied gate voltage can increase or decrease the vertical electric fields causing the structure inversion asymmetry. In this way, the precession frequency can be tuned and switching between the high and low resistance states can be controlled.

In operation, (and referring to the truth table in FIG. 3) without an applied voltage on the gate 120, the net electron spin polarization injected in the channel of the first FET 130 does not change when it reaches the ferromagnetic drain contact. Since in FET 130 the ferromagnetic source and drain contacts are in an anti-parallel magnetic configuration, the absence of applied gate voltage leads to a high-resistance state (i.e., OFF-state). For the second FET 135, without an applied voltage on the gate 120 the net electron spin polarization injected in the channel of the second FET 135 does not change when it reaches the ferromagnetic drain contact. Since in FET 135 the ferromagnetic source and drain contacts are in a parallel magnetic configuration, the absence of applied gate voltage leads to a low-resistance state (i.e., ON-state). Assuming the source of the first FET 130 is connected GND and the source of the second FET 135 is connected to $V_{DD}$, the absence of an applied gate voltage (i.e., no input signal) will lead to an output signal $V_{OUT}=V_{DD}$.

With an applied voltage on the gate 120, the strength of the intrinsic spin-orbit Rashba magnetic field in the channel region is modulated. As a result, the precession frequency of the spin-polarized electrons travelling through the channel is also modulated. This mechanism can be harnessed to generate a full reversal (i.e., 180°) of the electrons' spin-polarization when they reach the ferromagnetic drain contact. Therefore, with an applied voltage on the gate 120, the net electron spin polarization injected in the channel of the first FET 130 is flipped when it reaches the ferromagnetic drain contact. Since in FET 130 the ferromagnetic source and drain contacts are in an anti-parallel magnetic configuration, the presence of applied gate voltage leads to a low-resistance state (i.e., ON-state). For the second FET 135, with an applied voltage on the gate 120 the net electron spin polarization injected in the channel of the second FET 135 is flipped when it reaches the ferromagnetic drain contact. Since in FET 135 the ferromagnetic source and drain contacts are in a parallel magnetic configuration, the presence of applied gate voltage leads to a high-resistance state (i.e., OFF-state). Assuming the source of the first FET 130 is connected GND and the source of the second FET 135 is connected to $V_{DD}$, the presence of an applied gate voltage (i.e input signal) will lead to an output signal $V_{OUT}$=GND.

Example Spin-Based FET

A Spin-FET of the subject disclosure may include a GAA channel with a first conductive ferromagnetic contact electrically connected with a first portion of the GAA channel. A second conductive ferromagnetic contact is electrically connected with a second portion of the GAA channel. One contact is generally a spin injector (or polarizer) while the other ferromagnetic contact is a spin detector (or analyzer). The ferromagnetic contacts may be formed so that the remanent magnetization of electrons of the first conductive ferromagnetic contact is oriented in a direction opposite a remanent magnetization of electrons of the second conductive ferromagnetic contact.

The magnetic configuration of different ferromagnetic contacts may be formed to provide desired remanent magnetization characteristics depending on how one may want to program the possible states in the output of the device. For example, different magnetic materials and their combinations may be used to provide a desired remanence (e.g., Fe, Co, Ni, CoFe, and NiFe). The ferromagnetic contacts may use different magnetic multi-layer structures (for example, a set of layers including MgO/CoFeB/Ta or a set including AlO/CoFe/Ta). In some embodiments the shape or size of each ferromagnetic contact may be adjusted taking into consideration the volume of material (shape anisotropy) compared to the interface anisotropy.

Embodiments of the spin-FET may vary one or more features in the structure to provide programmable outputs. For example, by selecting the gate channel material to be either a non-degenerate semiconductor, a degenerate semiconductor, or a material that exhibits a high spin-orbit coefficient, the channel state output is controllable between ON and OFF states. For example, the gate channel material may be an electrically conductive material, alloy or multi-layer material with spatial inversion asymmetry in a direction orthogonal to a channel plane of the gate channel and/or with a high spin-orbit coupling constant λ that has an absolute value equal to or greater than 50 $cm^{-1}$. Other embodiments may recess extensions of the nanosheets. A cavity in the area of recessed extensions provides room for fitting the spin-injector/polarizer into the cavity. By positioning the spin-injector/polarizer into the cavity, the contact region may be formed using a metal exhibiting lower resistance reducing the overall contact resistance and improving device performance.

Example Spin-Based GAA Inverter

Embodiments of a spin-based GAA inverter of the subject disclosure generally include a FET with at least two vertically stacked top and bottom GAA channels. Embodiments may include three ferromagnetic contacts. A first conductive ferromagnetic contact is electrically connected to a first portion of the top channel and a first portion of the bottom channel. A second conductive ferromagnetic contact is electrically connected to a second portion of the bottom channel. The third conductive ferromagnetic contact is electrically connected to a second portion of the top channel. Generally, the second and third conductive ferromagnetic contacts may be isolated by a dielectric. The remanent magnetization of the first conductive ferromagnetic contact is oriented in a same direction as the remanent magnetization of the second conductive ferromagnetic contact. The remanent magnetization of the third conductive ferromagnetic contact is oriented in a direction opposite the remanent magnetization of electrons of the first and second conductive ferromagnetic contacts. While one configuration is shown, it will be understood that the connections of ferromagnetic contacts to either the top channel or the bottom channel may be modified to provide different programming structures. Similarly, the remanent magnetization of contacts may be switched or arranged differently for different output.

Example Methodology of Manufacture

In the following, a process describes a general method of forming a spin-based transistor device. The process branches off into variations of different embodiments that may be formed under the subject technology, including variations of the spin-based GAA FET and the spin-based GAA inverter.

Figure 4:
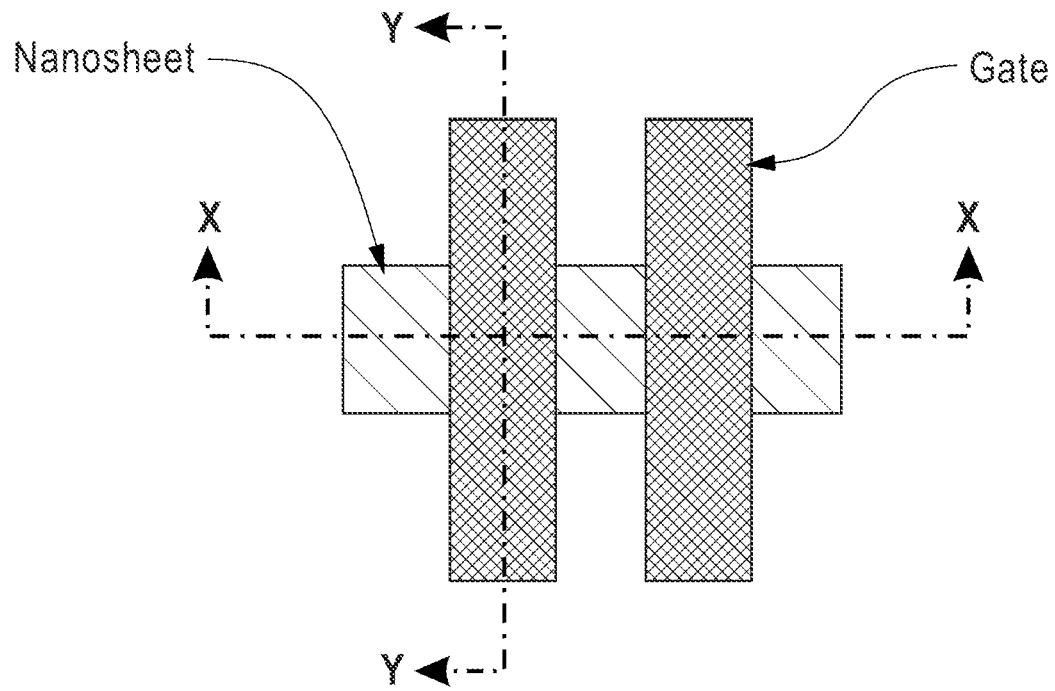
FIG. 4 is a legend showing axes of perspective for the views in FIGS. 6A/6B-37A/37B, consistent with embodiments of the present disclosure.

Reference is now made beginning at FIG. 4 to describe, by illustration, a method for manufacturing a spin-based transistor device. FIGS. 5-37B show a fabrication process including additive and subtractive processes to form some circuit elements in the end device. The additive and subtractive processes involved (for example, masking, depositing, etching, lithography, etc.,) may be known to those of skill in the art and will not necessarily be identified in each act shown. The fabrication of the devices described herein can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, a device can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit. In some figures, some reference numerals for elements not being affected by a step may not be repeated.

The following figures are shown in dual perspectives: one from the perspective of a stack of nanosheets showing an elevational view of layers in the device and one from the perspective of the gate region. FIG. 4 shows a legend providing the axes of a perspective view. The "X" axis represents the perspective along the nanosheet layers. The "Y" axis represents the perspective along the gate region. FIGS. 6A/6B through 37A/37B should be viewed with constant reference back to FIG. 4 recalling the perspective view being displayed. Otherwise, one may recall that each "A" figure is shown along the perspective of the nanosheet layers and each "B" figure is shown along the perspective of the gate region.

Figure 5:
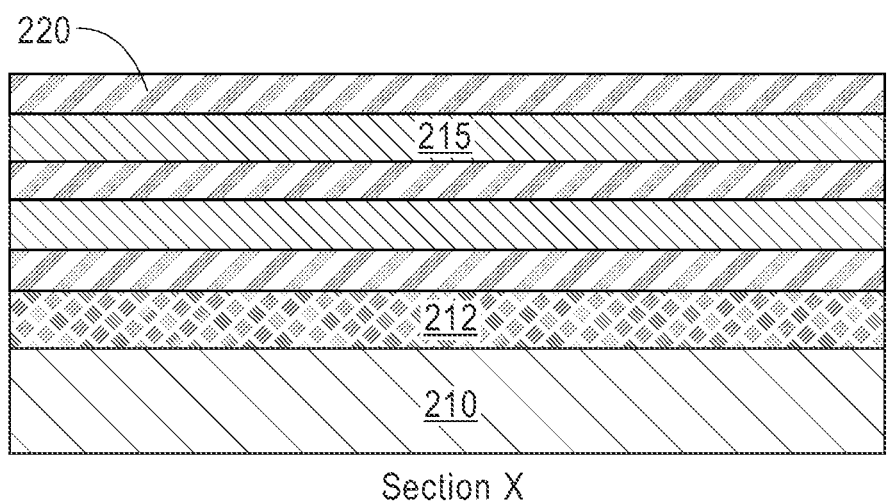
FIG. 5 is a cross-sectional view showing formation of an epitaxy stack of nanosheets, according to an embodiment.

Referring now to FIG. 5 as an initial part of the process, a plurality of nanosheets 215 and sacrificial suspensions 220 are stacked onto a sacrificial layer 212 (with a thickness of a semiconductor over a semiconductor substrate 210. The nanosheet stack may be grown as a blanket over the substrate using epitaxy techniques. The sacrificial layer 212 may allow for the formation of a dielectric isolation layer. The nanosheets 215 and sacrificial suspensions 220 will be used to form a GAA FET structure with vertically stacked channels. In the eventual structure, the nanosheets 215 will be the channels transferring carriers from source to drain. In some instances, the nanosheets 215 may be called the "channels 215" because the material may change type. As mentioned previously, embodiments may include a gate-all-around (GAA) that may surround the channels from multiple sides, if not all sides in some embodiments. The nanosheets 215 may be a semiconductor material including, for example, silicon with a thickness in the nanometer range. The sacrificial suspensions 220 may be formed from a silicon germanium mix (with a Ge % ranging from 15% to 40%), with a thickness ranging from 4 to 10 nanometers, although other thicknesses can be considered. To form the fin nanosheet stack, a patterning hard mask is deposited over the nanosheet epitaxy stack. The hard mask may then be patterned using standard lithography techniques. The fin nanosheet stacks may then be formed using directional anisotropic etch techniques (for example, a Reactive Ion Etching (ME)). The example shown includes two fin nanosheet stacks of alternating nanosheets 215 and sacrificial suspensions 220 layers, which will result in two channels passing through the gate material for each fin nanosheet stack. However, it will be understood that other embodiments may stack more layers to create additional channels. In addition, while the layers are shown in one plane, channels may be developed along other planes, including orthogonally to the plane shown to provide additional output combinations. While following the description of features added or removed from one figure to the next, it will be understood that while some features are repeatedly called out in subsequent figures (for sake of providing reference points in the drawings), the description may not repeat every element that is called out or previously described, for sake of brevity.

FIGS. 6A and 6B show deposition of a spacer material 230 over dummy gate material 224. The spacer material 230 may be, for example, a low-k value material (e.g., silicoboron carbonitride (SiBCN). The dummy gate material 224, for example, amorphous silicon or poly silicon may be deposited over the dummy gate dielectric layer 211. In some embodiments, the dummy gate material 224 may be planarized. A gate hard mask tri layer: (for example, an oxide, a dielectric layer 226 (for example, SiN), and a dielectric layer 228 (for example, SiO)) may be deposited in a blanket over the current structure. Gate hard mask patterning may be performed using standard patterning techniques. The gate may be formed using a directional anisotropic etch (for example, a Reactive Ion Etching (ME) process). The spacer material 230 may be formed using a conformal blanket deposition of a low-k material (for example, SiOC, SiON, SiOCN, SiBCN).

FIGS. 7A and 7B show formation of the source-drain trenches self-aligned to the gate region. Focus is primarily on FIG. 7A, which shows how the source/drain trenches are formed self-aligned to the gate. A directional anisotropic etch (for example, ME) may be used to form the gate's spacer material 230 on the gate sidewalls. The directional etch removes the spacer 230 material from horizontal surfaces while preserving it on vertical surfaces. A directional anisotropic etch (for example, ME) may be used to recess the fins as self-aligned to the spacer material 230 to form the source-drain trenches in-between fins. If present in the structure, the dielectric layer 212 can act as an etch stop due to its selectivity to the fin recess etch.

FIGS. 8A and 8B show selective inward indentation of the suspensions 220 from the sides. The material of suspensions 220 may be selectively etched in the extension regions defined by the spacer material 230. A recess sidewall 217 of the suspensions 220 may be aligned with an inner wall of the spacer material 230 and the inner spacer cavity formed by the removal of sacrificial suspensions 220 may extend to the sidewall edges of nanosheets 215.

FIGS. 9A and 9B show formation of inner spacers 232. A conformal liner coating every exposed surface may be deposited over the structure, including the inner spacer cavities formed by selective indentation of suspensions 220. A pinch-off mechanism of the conformal liner within the inner spacer cavities form the dielectric inner spacers 232. The conformal liner may be for example, an iRAD silicon nitride (SiN) or a low-k value dielectric material (for example, SiOC, SiON, SiOCN, SiBCN.).

FIGS. 10A and 10B show deposition of an inter-layer dielectric 238 over fill, which may cover the conformal liner on the outsides of fins 235 and in the trench between fins 235. In some embodiments, chemical-mechanical planarization may be performed removing the dielectric layer 226 and dielectric layer 228 and portions of the conformal liner 232 and spacer material 230 at the top of fins 235, exposing the dummy gate material 224.

FIGS. 11A and 11B show selective removal of the dummy gate material 224, the dummy gate dielectric layer 211, and sacrificial silicon-germanium suspensions within the stack of nanosheets exposing the channels 215. The sacrificial suspensions 220 are selectively removed creating suspension cavities in-between vertically adjacent channel layers 215 (called out as 220e) to enable formation of the final high-K metal gate (HKMG) stack wrapping all-around the channels 215.

FIGS. 12A and 12B show formation of the final gate dielectric and metal gate stack. The empty gate regions (220e) may be filled with a high-k metal gate (HKMG) stack 250 including the deposition of a conformal high-K gate dielectric followed by the deposition of the work function metal (WFM) stacks (for example, TiN, TiC, TiCAl). In some embodiments a gate metal fill 245 may be added to the HKMG stack 250. Following the formation of the HKMG stack, the gate metal fill 245 and the HKMG stack 250 can be recessed to form a self-align contact (SAC) dielectric cap 240 (for example, SiN, SiO, SiOC, SiON, SIOCN, SIBCN, SiC, AlOx, or similar)).

Figures 13A, 13B:
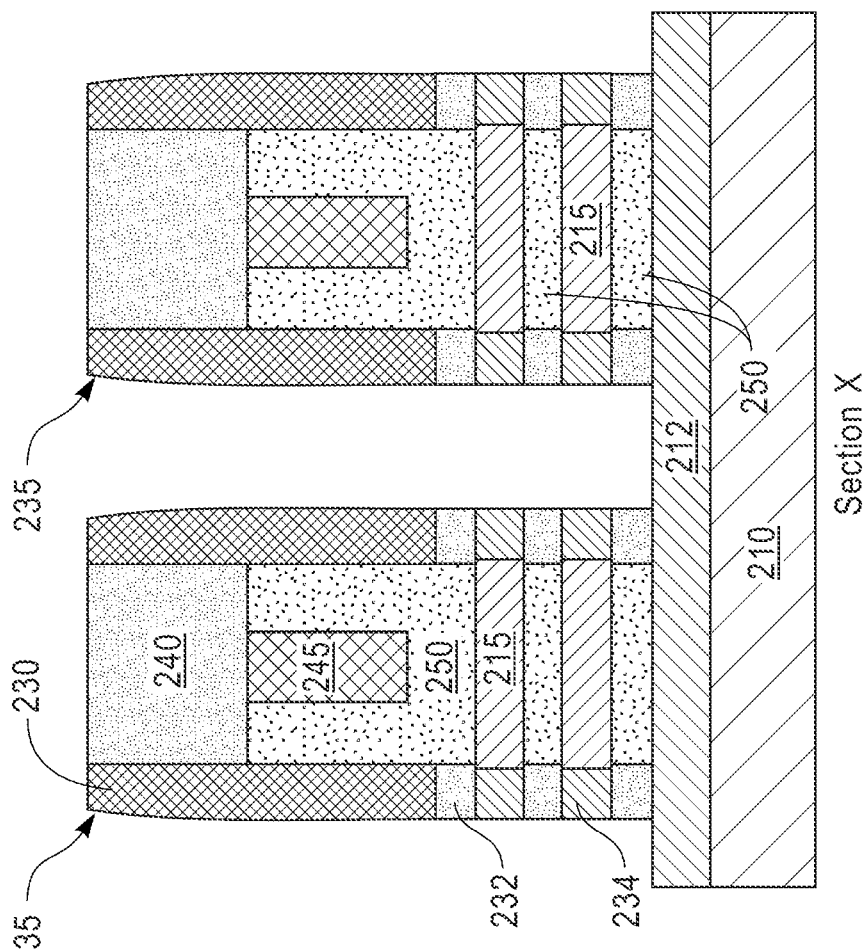
FIGS. 13A-13B show views of plasma doping of conductor channels, according to an embodiment.

In FIGS. 13A and 13B, source-drain contact regions are formed adjacent to the gates. The inter-layer dielectric 238 may be removed after contact patterning using an anisotropic etch to expose the conformal liner. The conformal liner is then removed using an isotropic etch to expose the spacer material 230, the edges of channels 215 and the formed inner spacers 232.

The figures that follow herein branch to show variations in the structure disclosed with the processes involved to provide the different structures. Each example variation will be captioned. In some instances, the process for a different embodiment will retrace back to the formation shown in FIGS. 13A and 13B but involving some change to the structure at that point.

Example Spin GAA Nanosheet FET with Non-Recessed Sheet Extensions and Non-Degenerate Semiconductor Channel Referring still to FIGS. 13A and 13B, in some embodiments, the channel material of channels 215 extend in alignment with the outer surface of the spacer material 230 and inner spacers 232 (in other words, non-recessed). In some embodiments, the material in channels 215 may be a non-degenerate semiconductor. Doping of the channel extension regions 234 can be performed using known techniques, for example the combination of conformal plasma doping and a thermal anneal for dopant drive-in. The ability to control the doping level at the channel interface may optimize the contact resistance at a metal-semiconductor interface and improve the performance of the device. In the case of spintronic applications, such as Spin-FETs, controlling the doping level at the ferromagnetic-semiconductor interface is also required for optimal design of the spin-injector. The role of a properly designed spin-injector is to maximize the injection of spin-polarized carriers from the ferromagnetic contact into the channels 215. In some embodiments, spin-injectors might be based on tailored Schottky barriers at the metal-semiconductor interface or Magnetic Tunnel Junctions (MTJ) using ultra-thin MgO or AlO barriers.

FIGS. 14A and 14B show formation of ferromagnetic contacts. Ferromagnetic materials may be deposited in the source-drain trenches in contact with the semiconductor channels 215. Different ferromagnetic contacts may be formed for the source contacts and drain contacts such that the remanent magnetization of the source and drain contacts can be oriented in opposite directions (anti-parallel). In embodiment of FIGS. 14A and 14B, the metal in the central trench (for example, the source) may form a first ferromagnetic contact 255 (sometimes referred to as the "first contact 255"). The metal on the outside trenches (for example, the drain) may form a second ferromagnetic contact 260 (sometimes referred to as the "second contact 260") that may be independent from the first ferromagnetic contact 255. The drawing shows that the first contact 255 and the second contacts 260 have respective remanent magnetizations with opposite orientations. The embodiment shown is an example of an out-of-plane magnetic configuration for the ferromagnetic contacts 255 and 260 relative to the spin-injection interface (edge of channels 215). The desired magnetic configuration of the ferromagnetic contacts (either the aforementioned or varieties described below) by designing the remanent magnetization using combinations of different ferromagnetic metals, different magnetic multi-layer structures, and varying the size or shape of a contact structure. Different metals may include for example, Fe, Co, Ni, CoFe, and NiFe. Examples of multi-layer structures include layers of MgO/CoFeB/Ta or layers of AlO/CoFe/Ta. The design, shape and size of contact structures may be based on evaluating the volume of material (shape anisotropy) compared to interface anisotropy of materials in the contact structure.

FIGS. 15A and 15B show an embodiment similar to the embodiment shown in FIGS. 14A and 14B except that the ferromagnetic contacts 255 and 260 in FIGS. 14A and 14B have a polarization oriented in a horizontal plane, while the ferromagnetic contacts 255 and 260 in FIGS. 15A and 15B have a polarization oriented in a vertical plane. The embodiment shown is an example of an in-plane magnetic configuration for the ferromagnetic contacts 255 and 260 relative to the spin-injection interface (edge of channels 215).

FIGS. 16A and 16B show adding conductor metal contacts 265 to the ferromagnetic contacts 255 and 260. In some embodiments, the device state shown in FIGS. 16A and 16B represent a finalized device. The ferromagnetic contact 260 may be the source of spin-polarized carriers. Spin-polarized carriers travel from the ferromagnetic contact 260 through the channels 215. In some embodiments, the channels 215 may not necessarily be semiconductor materials and may instead be referred to as conductor channels 215. In the disclosure below, embodiments will refer to the channels 215 as conductor channels 215 with the type of material specified.

Example Spin GAA Nanosheet FET with Recessed Sheet Extensions and Non-Degenerate Conductor Channel Referring now to FIGS. 17A and 17B, which are similar to FIGS. 13A and 13B, except that FIGS. 17A and 17B show the selective recessing of the conductor channels 215. In some embodiments, recessing the channels 215 may occur prior to forming metal contacts. The conductor channels 215 may remain a non-degenerate semiconductor. As shown, the selective recessing does not necessarily align the edges of the conductor channels 215 to the inner edges of spacer material 230 and inner spacers 232. Although, the recessing may remain at least partly within the extension regions defined by spacer material 230 and inner spacers 232. FIGS. 18A and 18B show doping of the channel extension regions 219 which can be performed using known techniques, for example the combination of conformal plasma doping and thermal anneal for dopant drive-in.

Figure 19B:
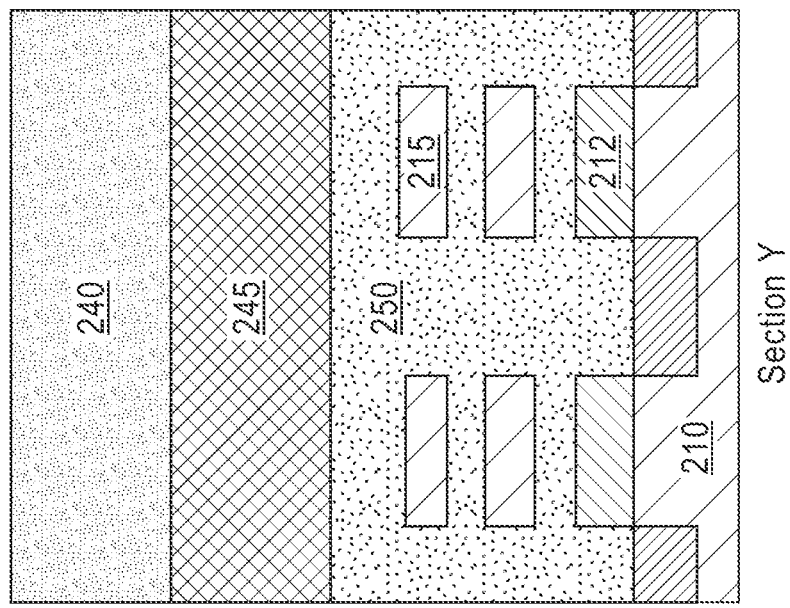
FIGS. 19A-19B show views forming ferromagnetic contacts, according to an embodiment.
Figure 19A:
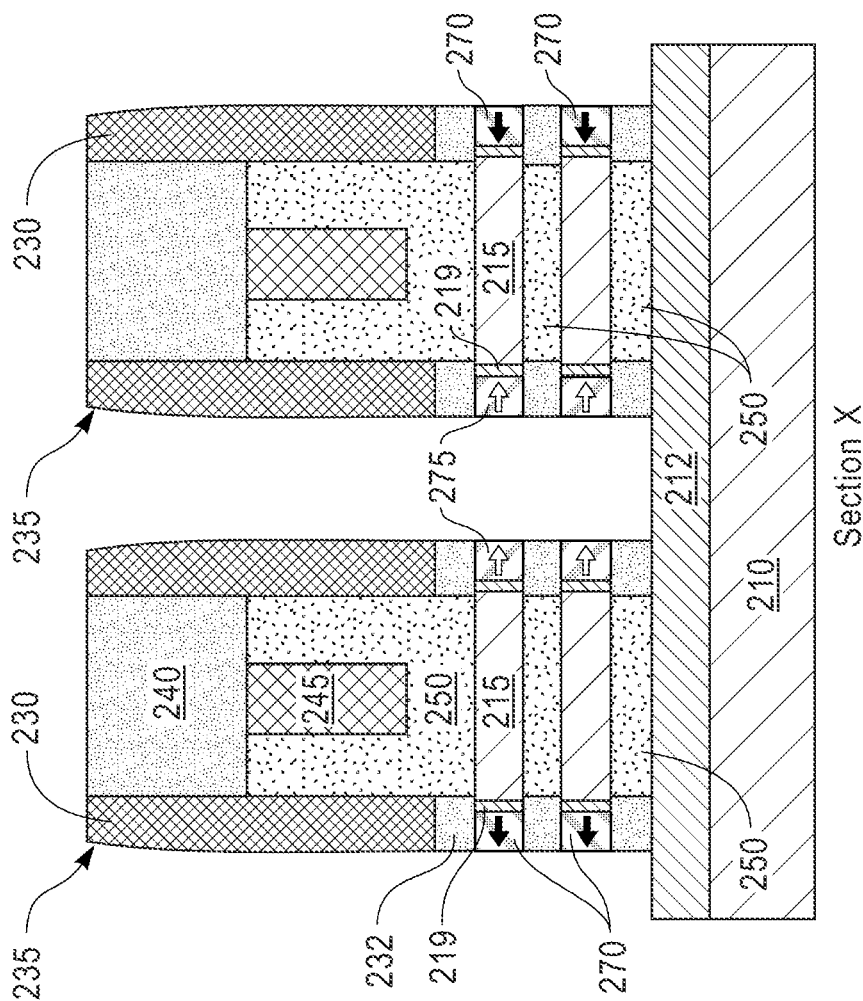

FIGS. 19A and 19B show addition of ferromagnetic contacts 270 and 275 into the cavities formed in the extension regions next to the edges of the conductor channels 215, under the inner spacers 232. The ferromagnetic contacts 270 may have a different magnetization orientation compared to the ferromagnetic contacts 275. As shown, each conductor channel 215 may have a dedicated contact 270 and contact 275 (as compared to previous embodiments that shared some of the contacts between different channels). The configuration of contacts 270 and 275 in FIGS. 19A and 19B are oriented horizontally and provide an example of out-of-plane magnetic configuration relative to the spin-injection interface (edge of channels 215). FIGS. 20A and 20B are similar to FIGS. 19A and 19B except that the contacts 270 and 275 have polarization oriented in the vertical direction and are an example of an in-plane magnetic configuration relative to the spin-injection interface (edge of channels 215). FIGS. 21A and 21B show metallization, adding metal contacts 280 to the ferromagnetic contacts 270 and 275. FIGS. 21A and 21B build from FIGS. 20A and 20B but it will be understood that the metallization may equally be applied to the configuration in FIGS. 19A and 19B.

Figure 22B:
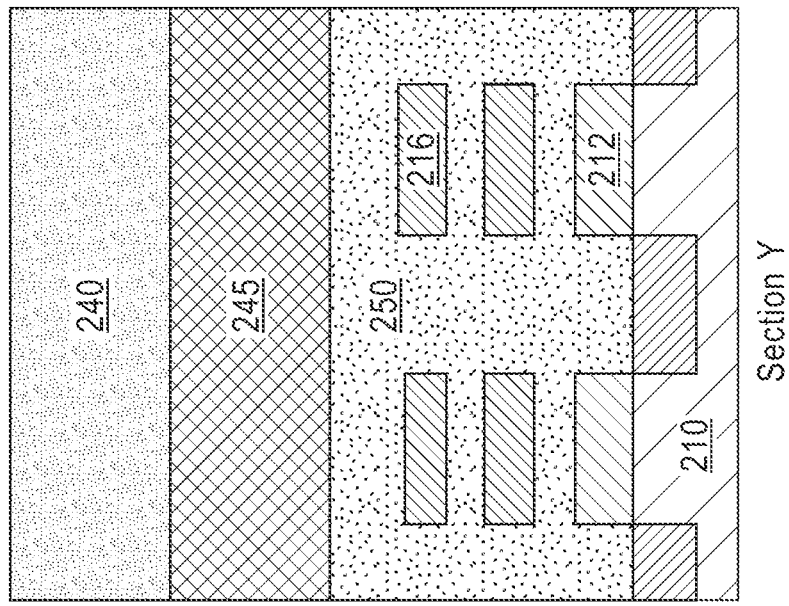
FIGS. 22A-22B show views show views consistent with the views of FIGS. 19A and 19B, except with a different channel material, according to an embodiment.
Figure 22A:
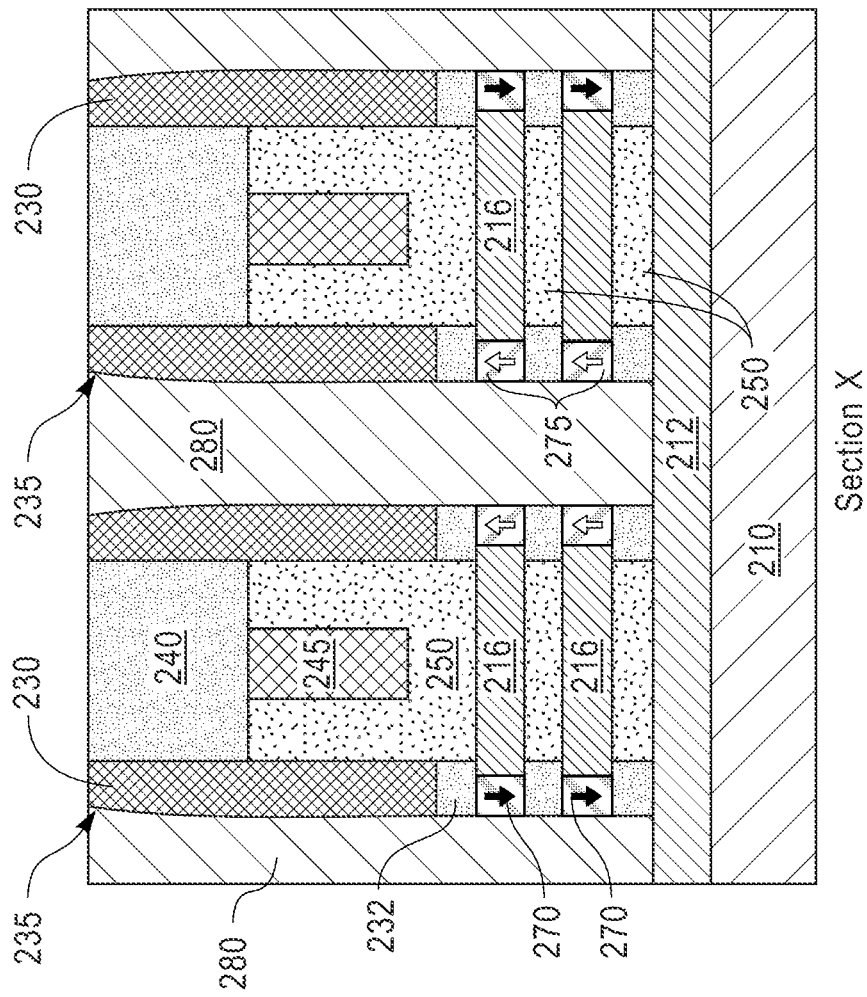

Example Spin GAA Nanosheet FET with Recessed Sheet Extensions and Degenerate Conductor Channel FIGS. 22A and 22B show an embodiment similar to the device shown in FIGS. 21A and 21B, except that the non-degenerate material in conductor channels 215 is replaced with a degenerate semiconductor material 216. As may be appreciated, the high level of doping in the degenerate material starts to act more like a metal than as a semiconductor which affects the transfer of carriers through the channels. For example, a degenerate semiconductor has less resistivity than a non-degenerate semi-conductor and provide more conductance for carrier flow. In some embodiments, the use of a degenerate material 216 may make the HKMG 250 less necessary to control the conduction of carriers through the channel. However, the applied gate voltage is still required to tune the electron density in the channel, and thereby the strength of the Rashba spin-orbit coupling, i.e., the strength of the intrinsic spin-orbit Rashba magnetic field to manipulate the spin of the carriers. The desired output resistance may be dictated primarily by the configuration of ferromagnetic contacts 270 and 275.

Figure 23B:
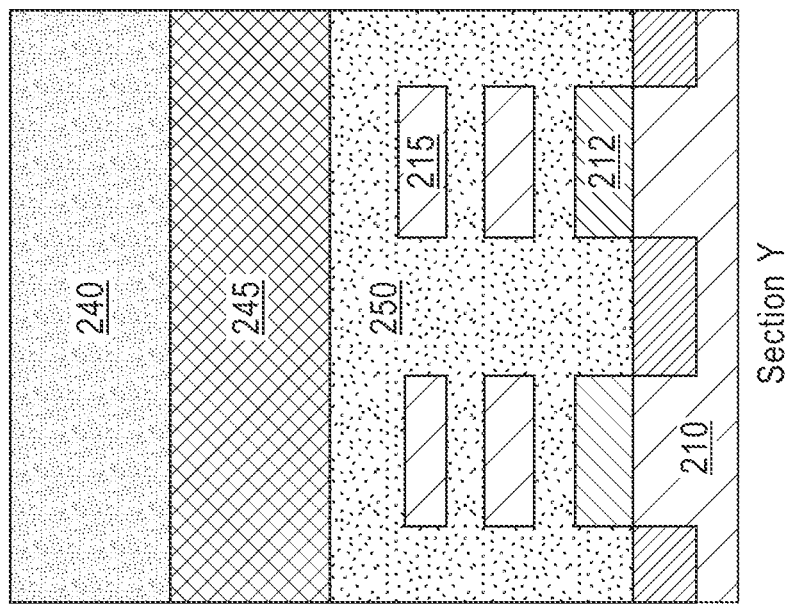
FIGS. 23A-23B show views of fins with non-recessed channel conductors, according to an embodiment.
Figure 23A:
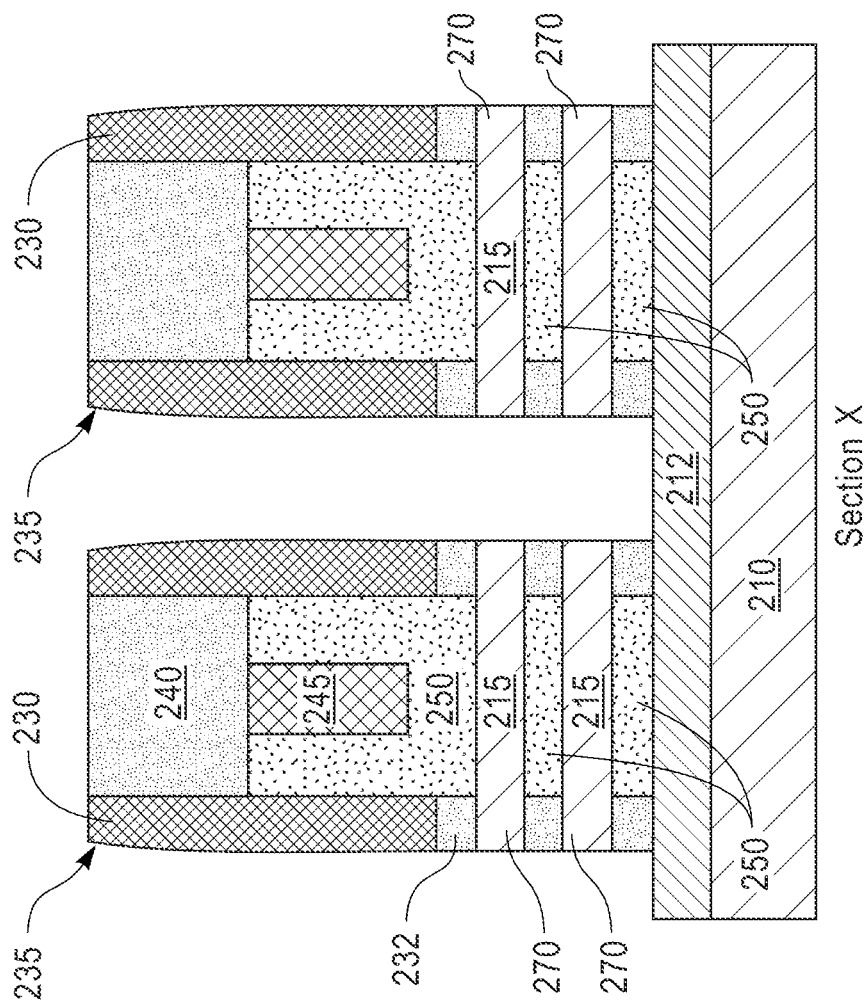

Example Spin GAA Nanosheet FET with Non Recessed Sheet Extensions and High Spin Orbit Coupling Coefficient Channel Material In the instant embodiment, the process may begin at FIGS. 23A and 23B. Sacrificial silicon channels 215 are selectively stripped away from the channel region in FIGS. 24A and 24B leaving behind channel cavities 215e. The removed material may be replaced with a high spin orbit coupling coefficient material 290 that is filled into the channel cavities 215e and around the exterior of the fins 235 using for example a conformal deposition (FIGS. 25A and 25B). Examples of high spin orbit coupling coefficient material 290 include tungsten, platinum, and a gold-tungsten alloy although other high-Z materials and alloys can be considered. FIGS. 26A and 26B show isotropic etching of the material 290 removing excess material from areas outside of the conductor channels 215. In other embodiments, the process disclosed at FIGS. 23A and 23B may use a different material instead of the high-spin orbit material. For example, the material 290 may be a two-dimensional material such as graphene, $MoS_2$, $WSe_2$, $SnS_2$, h-BN, $VO_2$, etc. In another embodiment, the material 290 may be a topological material, such as a topological insulator.

Figures 27A, 27B:
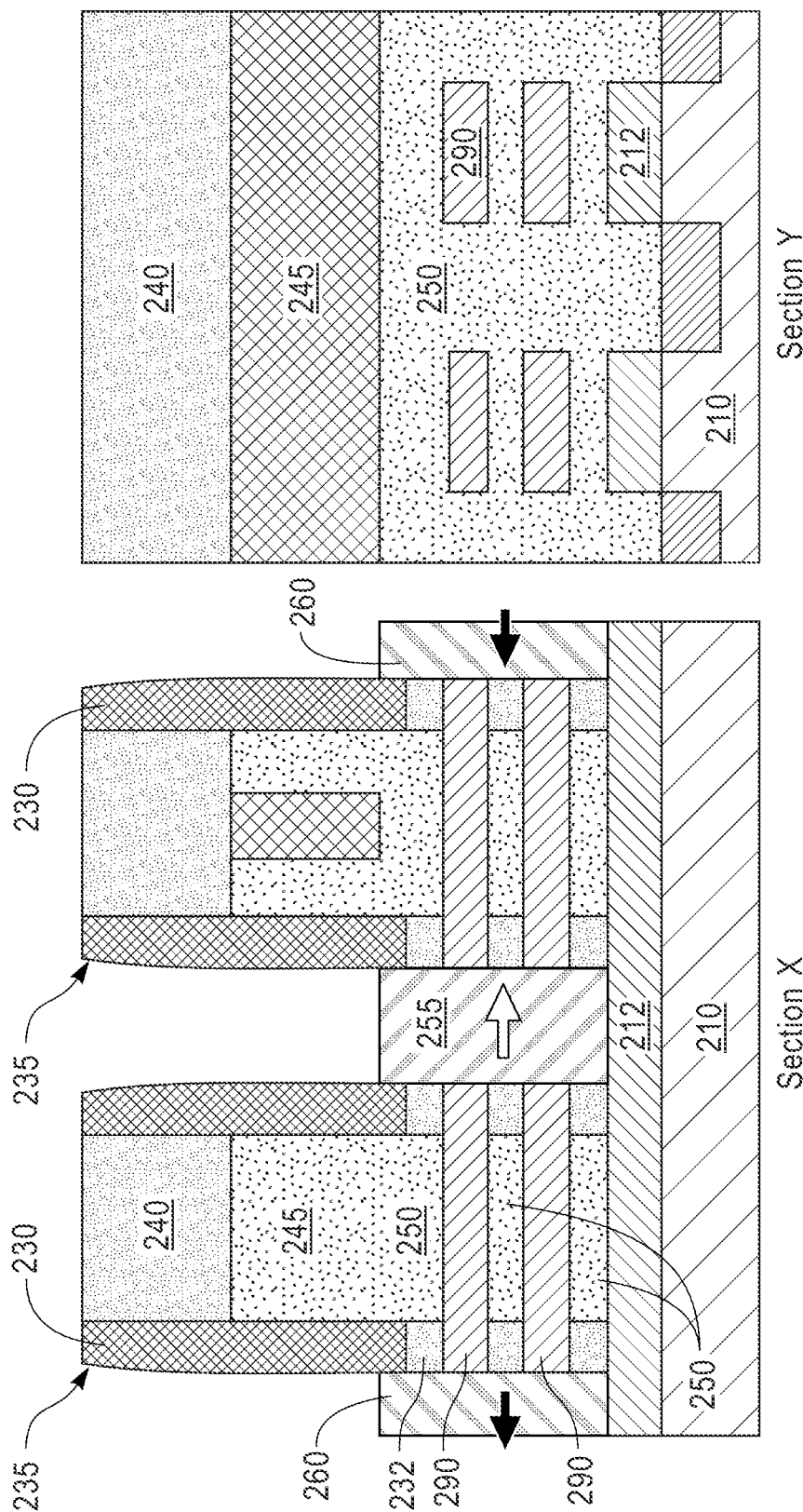
FIGS. 27A-27B show views forming ferromagnetic contacts, according to an embodiment, according to an embodiment.
Figure 29A:
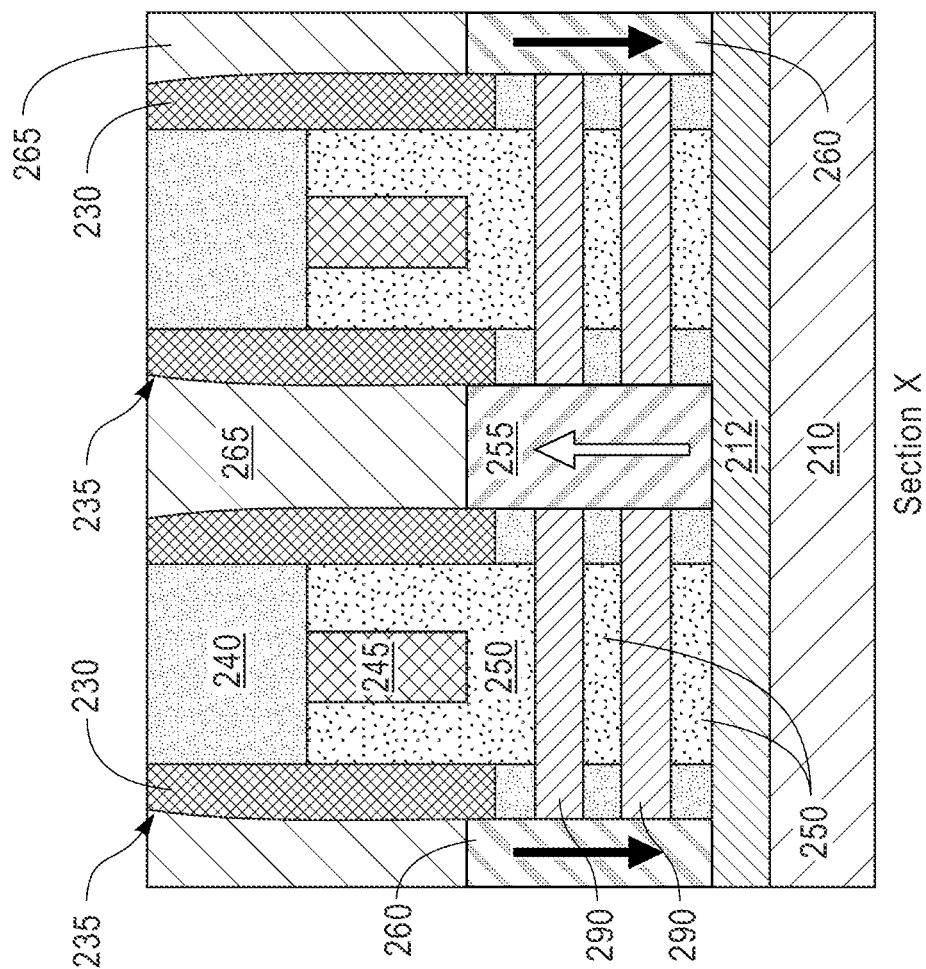
FIGS. 29A-29B show views forming metal contacts, according to an embodiment, according to an embodiment.
Figure 29B:
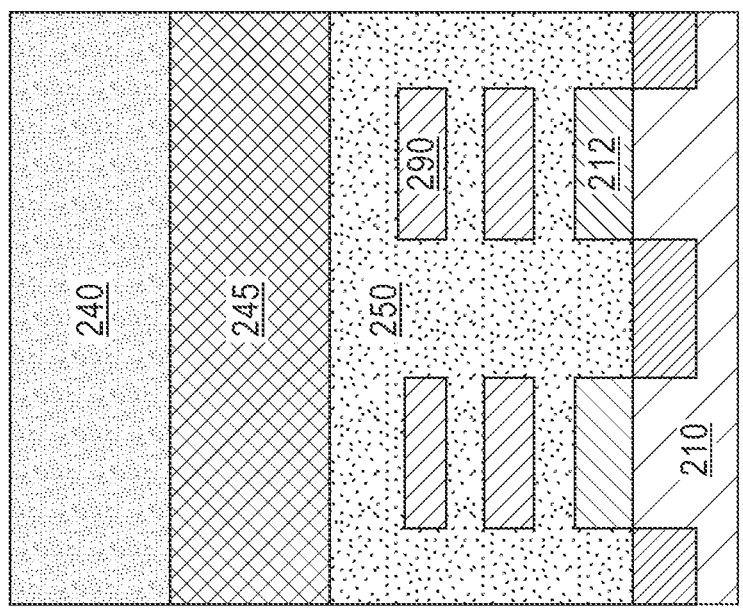

FIGS. 27A and 27B show addition of ferromagnetic contacts 255 and 260, the configuration of which is similar to the configuration shown in FIGS. 14A and 14B. FIGS. 28A and 28B show an embodiment using the high spin orbit coupling coefficient material 290 for the conductor channels 215 using ferromagnetic configuration similar to the configuration shown in FIGS. 15A and 15B. FIGS. 29A and 29B add the metal contacts 265 to the ferromagnetic contacts 255 and 260.

Example Spin GAA Nanosheet FET with Recessed Sheet Extensions and High Spin Orbit Coupling Coefficient Channel Material FIGS. 30A and 30B show and embodiment similar to the embodiment of FIGS. 29A and 29B except that the sheet extensions used to make the conductor channels 215 are recessed similar to the embodiment shown in FIGS. 17A and 17B. Also, the configuration of ferromagnetic contacts is similar to the configuration used in FIGS. 20A and 20B.

Example Spin GAA Nanosheet CMOS Inverter

Figure 32B:
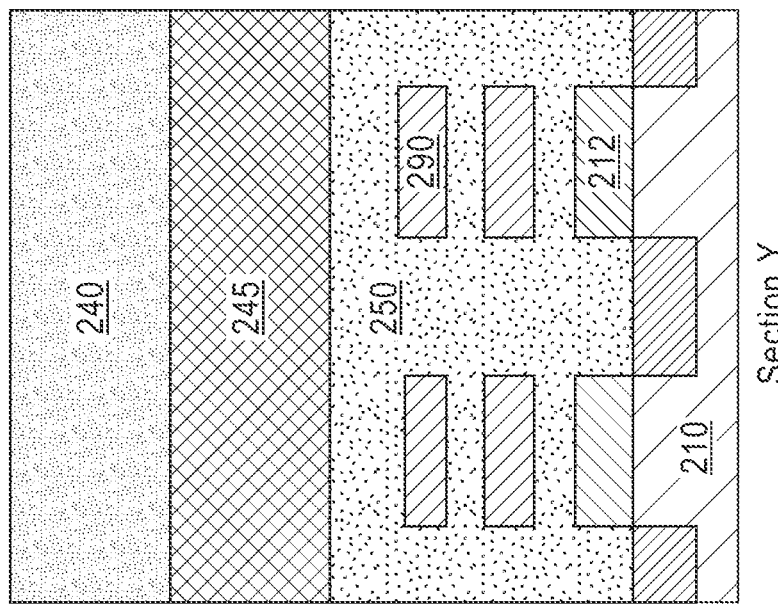
FIGS. 32A-32B show views forming ferromagnetic contacts, according to an embodiment, according to an embodiment.
Figure 32A:
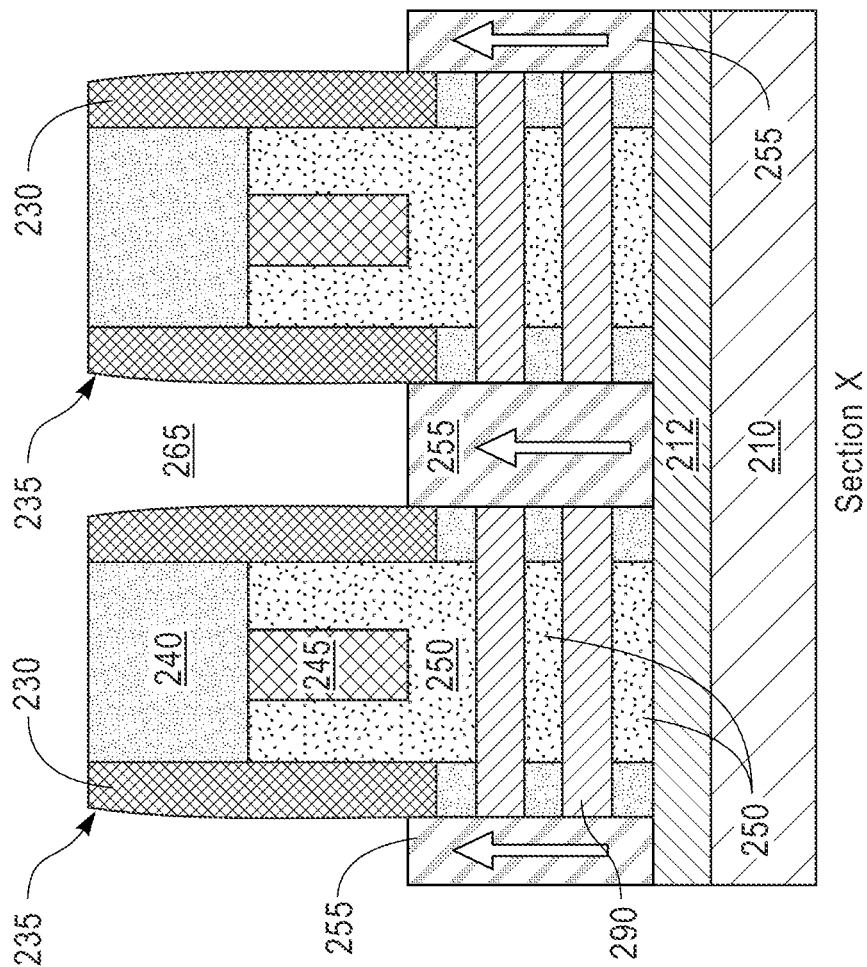
Figure 33B:
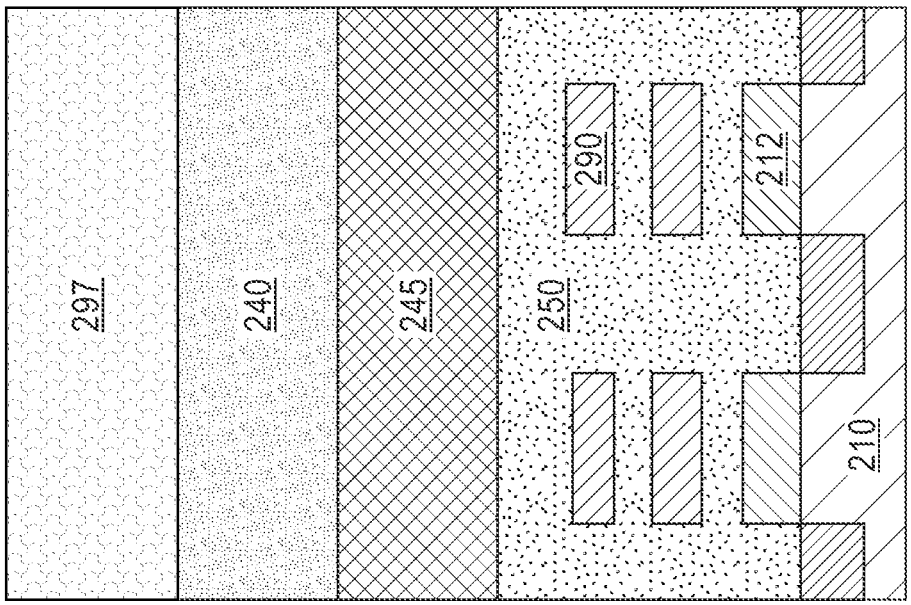
FIGS. 33A-33B show views selectively recessing one or more ferromagnetic contacts, according to an embodiment, according to an embodiment.
Figure 33A:
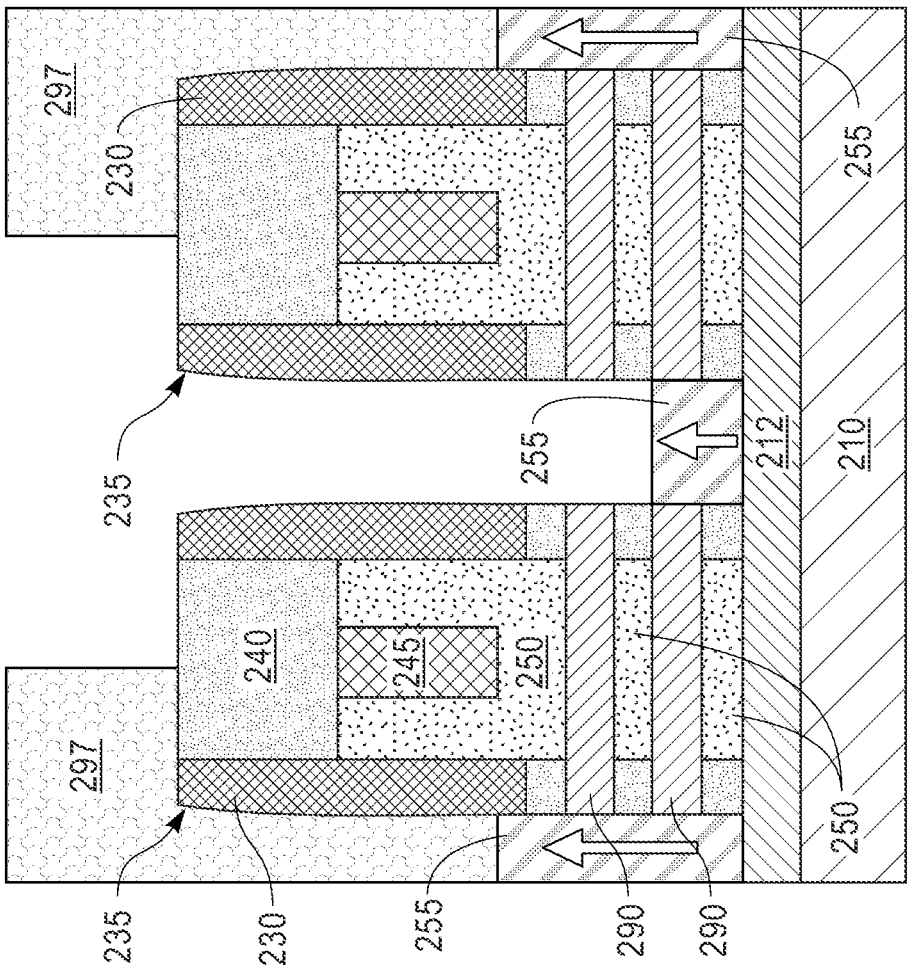
Figure 37A:
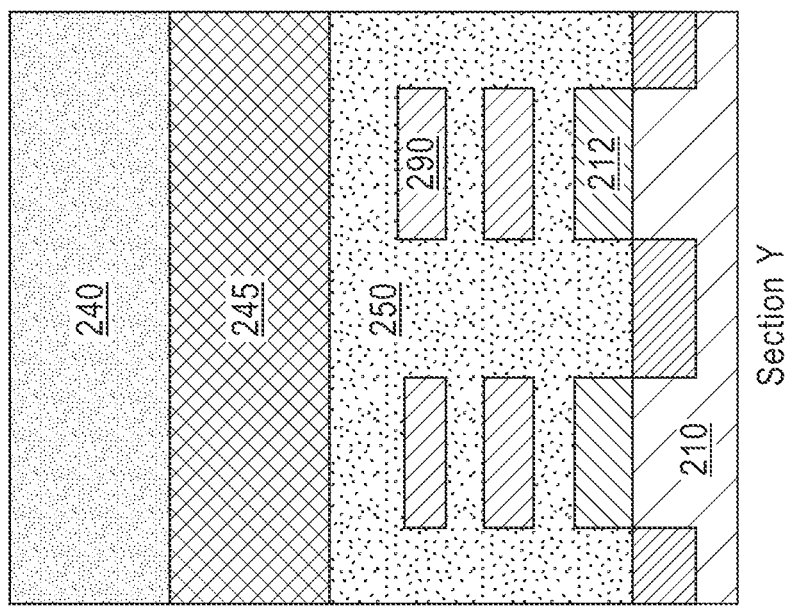
FIGS. 37A-37B show views consistent with FIGS. 36A and 36B, but with ferromagnetic contacts using an alternate magnetic configuration, according to an embodiment, according to an embodiment.
Figure 37B:
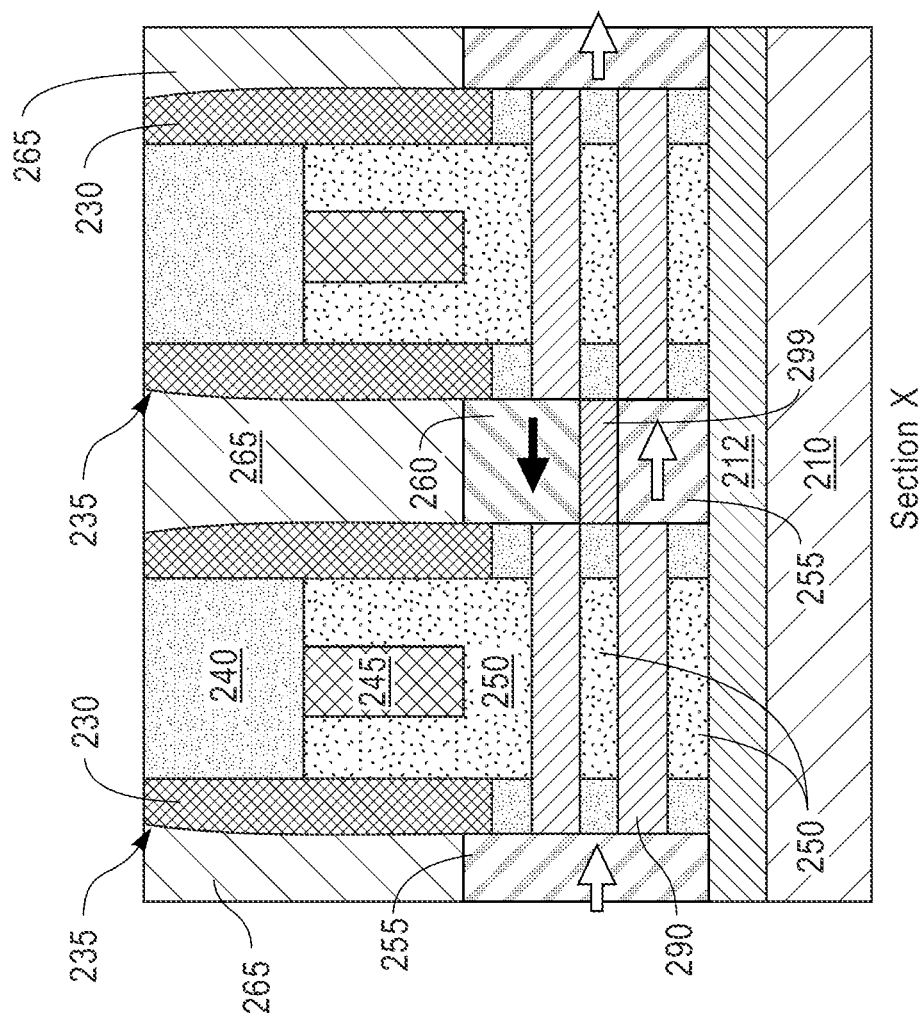

FIGS. 31A and 31B show a structure similar to the embodiment shown in FIGS. 26A and 26B (however, another conductor material such as silicon may be used in lieu of the high spin orbit coupling coefficient material 290 shown). FIGS. 32A and 32B show formation of first ferromagnetic contacts 255. As can be seen the three contacts are the same in material with the same magnetic configuration. The ferromagnetic contact 255 in the trench 265 that is shared by the two gates is initially aligned to the same height as the contacts 255 on the outsides of the fins 235. Referring now to FIGS. 33A and 33B, in some embodiments, an organic planarization layer (OPL) 297 coating may be deposited. The OPL 297 may be patterned and etched to expose ferromagnetic contacts 255. Selective recessing of the central ferromagnetic contact 255 down to a height below the top conductor channel 215 may be performed. In some embodiments, any of the other ferromagnetic contacts 255 may be recessed instead or in addition to the central ferromagnetic contact 255. FIGS. 34A and 34B show adding a contact spacer 299 to the top of the central ferromagnetic contact 255 that was recessed. The OPL 297 may be removed after formation of the contact spacer 299. FIGS. 35A and 35B show formation of a second ferromagnetic contact 260 on top of the spacer 299 and over the central ferromagnetic contact 255. The ferromagnetic contact 260 is electrically in contact with the top conductor channel 215 and has a polarity opposite the ferromagnetic contacts 255. FIGS. 36A and 36B show the addition of metal contacts 265 to the ferromagnetic contacts 255 and 260. As may be appreciated, the right half of the figure shares the structure shown in FIG. 3. The structure shown is an example of an in-plane magnetic configuration relative to the spin-injection interface (edge of channels 215). FIGS. 37A and 37B are similar to the embodiment shown in FIGS. 36A and 36B, except that the magnetic configuration is oriented with a horizontal polarity. The configuration shows an example of an out-of-plane configuration relative to the spin-injection interface (edge of channels 215).

Example Application—Programming Memory

As may be appreciated, aspects of the disclosed transistor embodiments are potentially useful in several applications. In one illustrative application, spin-FETs of the subject disclosure may be used as memory devices. The devices may be "programmable". For example, if one of the contacts (for example source), has a fix magnetization orientation and the other contact (for example drain) has a programmable magnetization orientation, then the device can be used as a memory structure. The bit of information is encoded on the contact with the programmable magnetization orientation. Then the spin-FET is used to read the magnetic configuration. For example:

Source-Drain with same magnetic orientation=low resistance state (1).

Source-Drain with opposite magnetic orientation=high resistance state (0).

As may be understood by the above example, the spin-FET of the subject disclosure and its various embodiments, offers the potential of combining magnetic storage of information with electronic readout in a single device. However, it should be understood that other applications of the subject transistor structures are available and the above example was provided for sake of illustration only.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A spin-based semiconductor device, comprising:
   a field effect transistor (FET) with at least one Gate-All-Around (GAA) channel and a gate region of the spin-based semiconductor device;
   one or more first conductive ferromagnetic source/drain contacts electrically connected with a first portion of the at least one GAA channel; and
   one or more second conductive ferromagnetic source/drain contacts electrically connected with a second portion of the at least one GAA channel, wherein:
      a remanent magnetization of at least one of the one or more first conductive ferromagnetic source/drain contacts is oriented in a direction opposite to a remanent magnetization of a first one of the one or more second conductive ferromagnetic source/drain contacts,
      the one or more second conductive ferromagnetic source/drain contacts have a single shared body, and
      the at least one GAA channel extends between the one or more first conductive ferromagnetic source/drain contacts and the one or more second conductive ferromagnetic source/drain contacts.

2. The semiconductor device of claim 1, wherein a remanent magnetization of a second one of the one or more second conductive ferromagnetic source/drain contacts is oriented in a same direction as the remanent magnetization of the at least one of the one or more first conductive ferromagnetic source/drain contacts.

3. The semiconductor device of claim 1, further comprising an electrically conductive material, alloy or multi-layer material in the at least one GAA channel with spatial inversion asymmetry in a direction orthogonal to a channel plane of the at least one GAA channel and/or high spin-orbit coupling constant with an absolute value equal to or greater than 50 cm$^{-1}$.

4. The semiconductor device of claim 1, further comprising one of a degenerate semiconductor, a two-dimensional material, or a topological insulator, in the at least one GAA channel.

5. The semiconductor device of claim 1, further comprising a stack of nanosheets used as the at least one GAA channel.

6. The semiconductor device of claim 5, further comprising extension regions of the at least one GAA channel, wherein:
 ends of the nanosheets extend outside of the gate region and into the extension regions,
 ends of the nanosheets are recessed inward toward the gate region, within the extension regions, and
 the one or more first conductive ferromagnetic source/drain contacts and the one or more second conductive ferromagnetic source/drain contacts are positioned in the extension regions.

7. The semiconductor device of claim 6, further comprising regions of doped material in contact with the ends of the nanosheets and in contact with the one or more first conductive ferromagnetic source/drain contacts and the one or more second conductive ferromagnetic source/drain contacts, and positioned in areas defined by the recess of the nanosheets.

8. The semiconductor device of claim 5, wherein ends of the nanosheets are non-recessed inward toward the gate region.

9. A spin-based semiconductor device, comprising:
 a field effect transistor (FET) including at least two vertically stacked Gate-All-Around (GAA) channels in the spin-based semiconductor device, including a top channel and a bottom channel;
 a first conductive ferromagnetic source/drain contact electrically connected to a first portion of the top channel and a first portion of the bottom channel;
 a second conductive ferromagnetic source/drain contact electrically connected to a second portion of the bottom channel; and
 a third conductive ferromagnetic source/drain contact electrically connected to a second portion of the top channel, wherein:
  the the second conductive ferromagnetic source/drain contact and the third conductive ferromagnetic source/drain contact are isolated by a dielectric;
  the first conductive ferromagnetic source/drain contact provides a single shared body between the first portion of the top channel and the first portion of the bottom channel, and
  a remanent magnetization of the first conductive ferromagnetic source/drain contact is oriented in a same direction as a remanent magnetization of one of the second conductive ferromagnetic source/drain contact or the third conductive ferromagnetic source/drain contact; and
  a remanent magnetization of the second conductive ferromagnetic source/drain contact is oriented in a direction opposite the remanent magnetization of the third conductive ferromagnetic source/drain contact.

10. The semiconductor device of claim 9, wherein:
the remanent magnetization of the first conductive ferromagnetic source/drain contact is oriented in the same direction as a remanent magnetization of the second conductive ferromagnetic contact; and
the remanent magnetization of the third conductive ferromagnetic contact is oriented in a direction opposite the remanent magnetization of the first conductive ferromagnetic contacts and the remanent magnetization of the second conductive ferromagnetic contacts.

11. The semiconductor device of claim 9, wherein:
the remanent magnetization of the first conductive ferromagnetic source/drain contact is oriented in the same direction as the remanent magnetization of the third conductive ferromagnetic source/drain contact; and
the remanent magnetization of the second conductive ferromagnetic source/drain contact is oriented in a direction opposite the remanent magnetization of the first conductive ferromagnetic source/drain contact and the third conductive ferromagnetic source/drain contact.

12. The semiconductor device of claim 9, further comprising an electrically conductive material, alloy or multilayer material in the at least two vertically stacked GAA channels with spatial inversion asymmetry in the direction orthogonal to a channel plane of the at least two vertically stacked GAA channels and/or a high spin-orbit coupling constant λ with an absolute value equal or greater than 50 cm$^{-1}$.

13. The semiconductor device of claim 9, further comprising one of a degenerate semiconductor, a two-dimensional material, or a topological insulator, in the at least two vertically stacked GAA channels.

14. The semiconductor device of claim 9, further comprising:
 a gate region positioned on top of the top channel and surrounding the top and bottom channels;
 an extension region of the at least two vertically stacked GAA channels positioned adjacent the gate region, wherein ends of the top channel and the bottom channel extend outside of the gate region and into the extension region;
 a spacer layer positioned adjacent the gate region and in the extension region, and arranged to electrically insulate the gate region from the first conductive ferromagnetic source/drain contact, the second conductive ferromagnetic source/drain contact, and the third conductive ferromagnetic source/drain contact.

* * * * *